(12) United States Patent
Grinchuk et al.

(10) Patent No.: US 7,020,865 B2
(45) Date of Patent: Mar. 28, 2006

(54) PROCESS FOR DESIGNING COMPARATORS AND ADDERS OF SMALL DEPTH

(75) Inventors: Mikhail I. Grinchuk, San Jose, CA (US); Anatoli A. Bolotov, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 184 days.

(21) Appl. No.: 10/602,570

(22) Filed: Jun. 24, 2003

(65) Prior Publication Data

US 2005/0005255 A1    Jan. 6, 2005

(51) Int. Cl.
G06F 17/50    (2006.01)
(52) U.S. Cl. .................. 716/18; 716/2; 716/3; 716/7
(58) Field of Classification Search ............. 716/18, 716/2, 1, 7, 3; 326/104, 10
See application file for complete search history.

(56) References Cited

U.S. PATENT DOCUMENTS

| 6,367,054 | B1 | 4/2002 | Talwar | 716/2 |
| 2001/0044708 | A1 | 11/2001 | Talwar et al. | 703/2 |
| 2002/0026465 | A1 | 2/2002 | Rumynin et al. | 708/210 |
| 2002/0078110 | A1 | 6/2002 | Rumynin et al. | 708/210 |

OTHER PUBLICATIONS

Cortadella, "Timing-Driven Logic Bi-Decomposition", Jun. 2003, IEEE Transactions on Computer-Aided Design of Integrated Circuits, vol. 22, iss. 6, pp. 675-685.*
U.S. Appl. No. 10/017,802, Optimization of Comparator Architecture, filed Dec. 12, 2001.
U.S. Appl. No. 10/017,792, Opitimziation of an Adder Based Circuit Architecture, filed Dec. 12, 2001.

* cited by examiner

Primary Examiner—Sun James Lin
(74) Attorney, Agent, or Firm—Westman, Champlin & Kelly, P.A.

(57) ABSTRACT

Logic circuits for logical operations, based on a function $f_N = x_1$ OR $(x_2$ AND $(x_3$ OR $(x_4$ AND ... $x_N$ ... $)))$ or $f'_N = x_1$ AND $(x_2$ OR $(x_3$ AND $(x_4$ OR ... $x_N$ ... $)))$, are designed by defining a top portion of the logic circuit based on a pre-selected pattern of 2-input $ and @ gates. The top portion has N inputs and approximately N/3 outputs. A smaller logic circuit is defined having approximately N/3 inputs coupled to the outputs of the top portion. In one embodiment, the circuit is designed for a circuit having N' inputs, where N' is $3^n$ or $2*3^n$, and the N'−N most significant inputs are set to fixed values. The extra gates are removed resulting in a minimum depth circuit. In another embodiment, the depth is further reduced in some cases by designing a circuit for N−1 inputs and transforming the circuit to an N-input circuit. The $ and @ gates are converted to AND and/or OR gates, depending on the function.

15 Claims, 14 Drawing Sheets

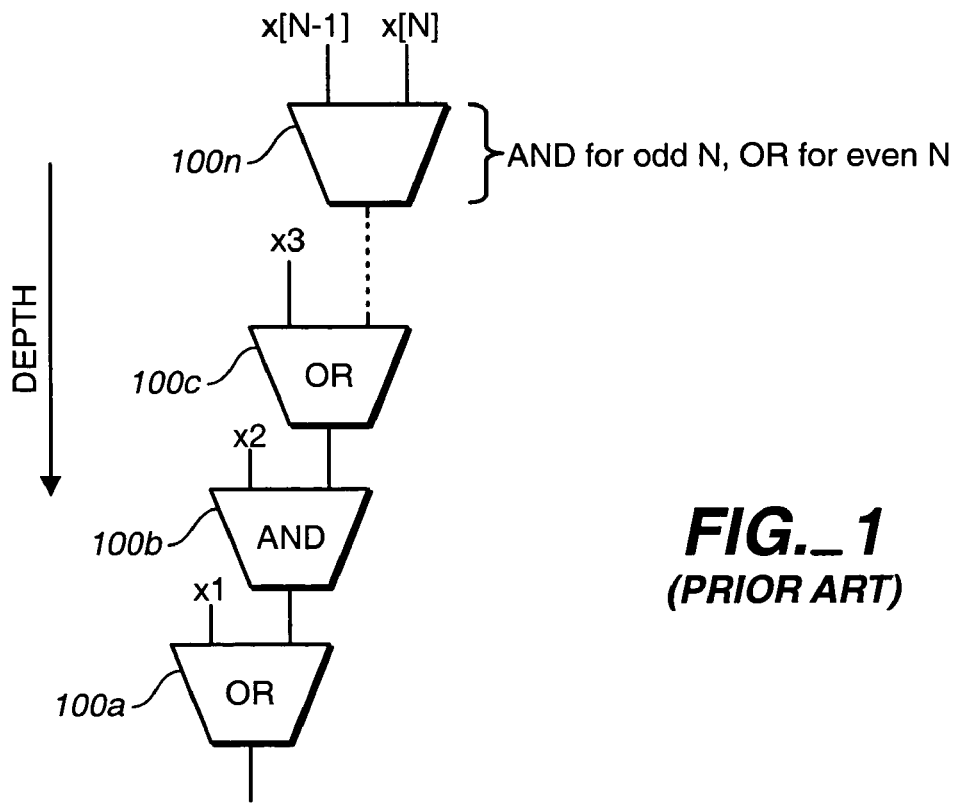
FIG._1
*(PRIOR ART)*
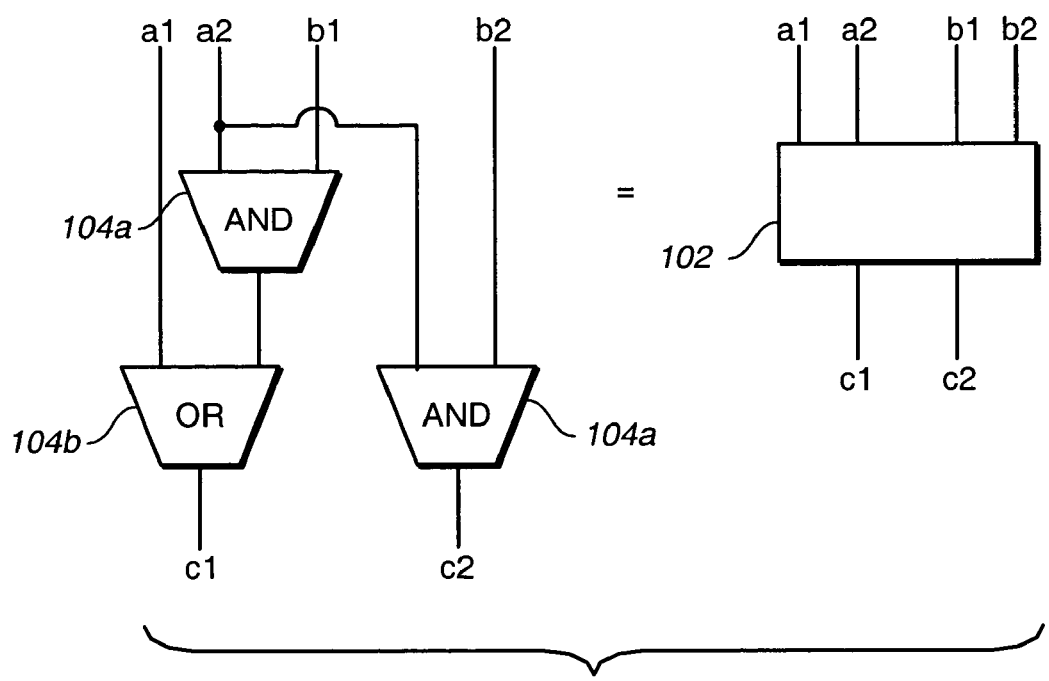
FIG._2

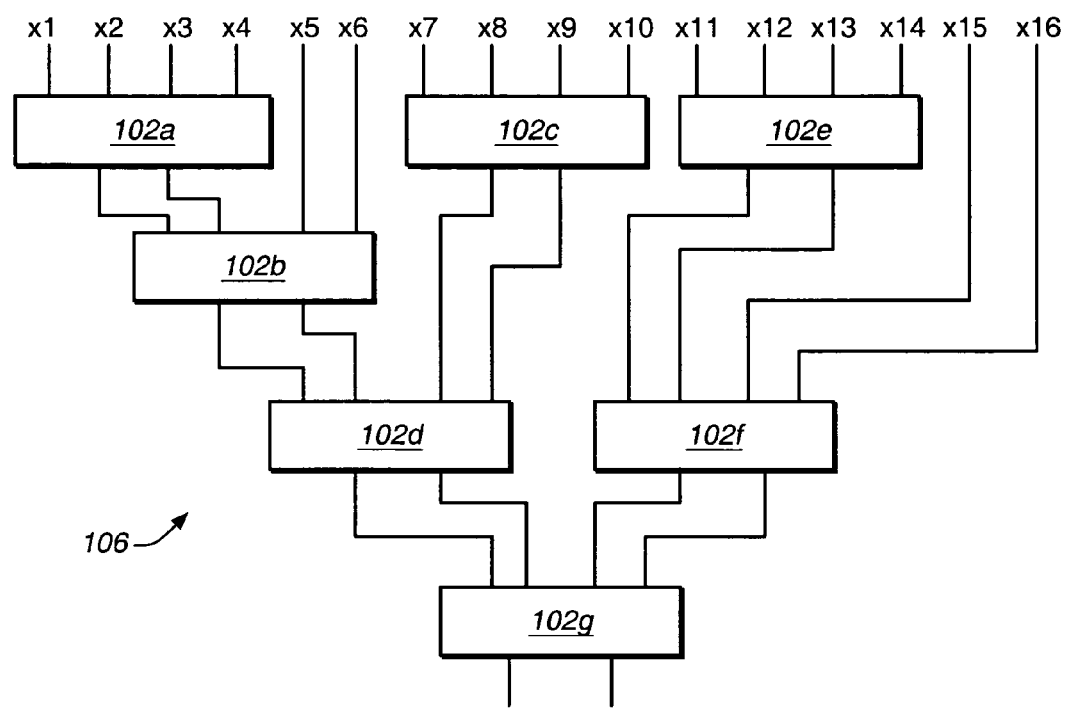
FIG._3

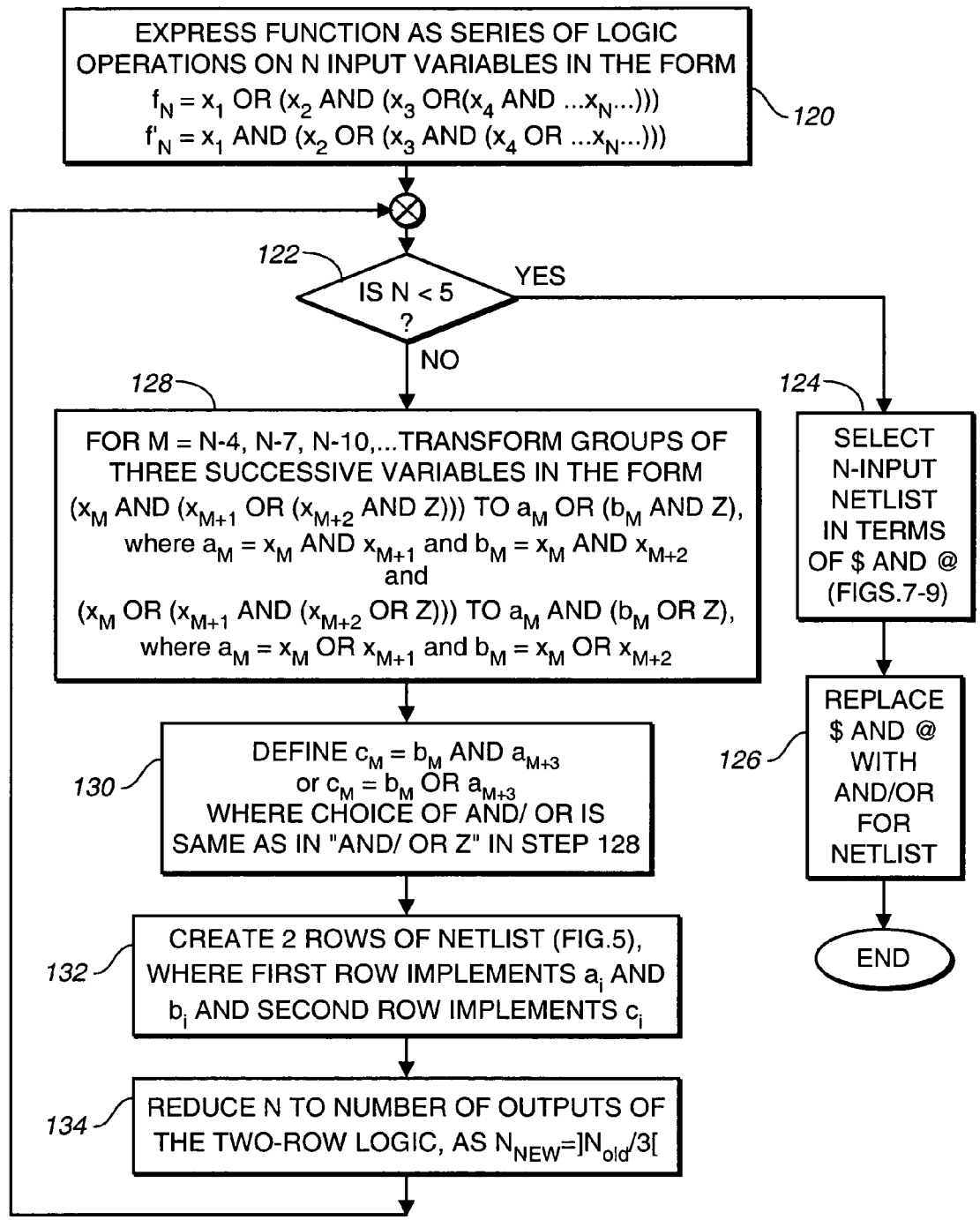
FIG._4

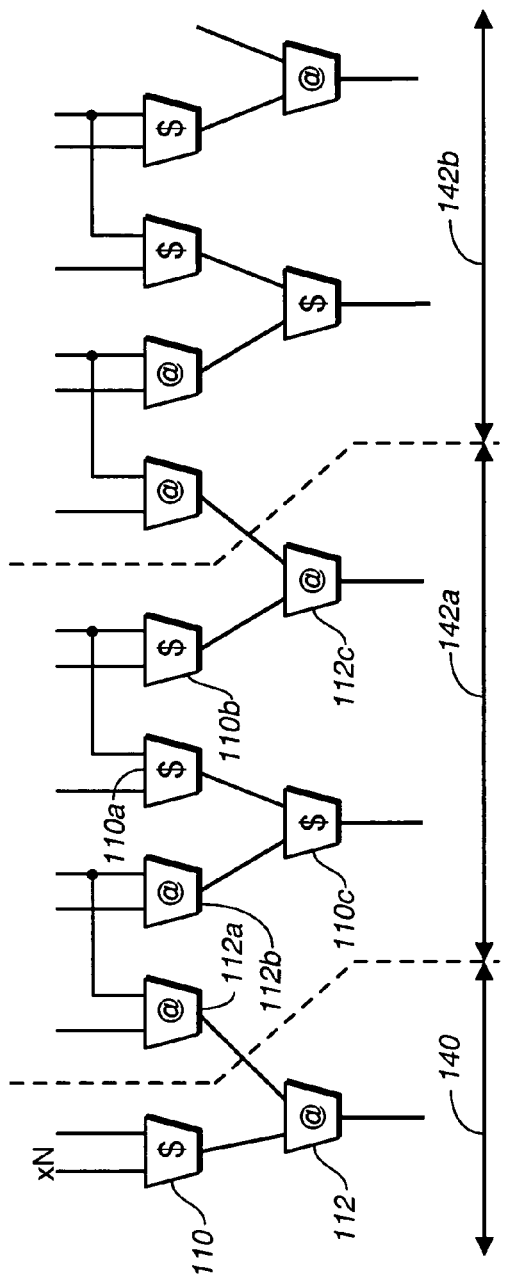
FIG._5
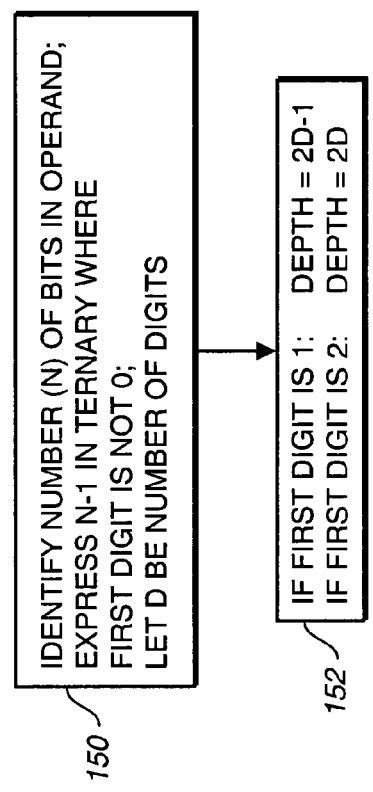
FIG._6

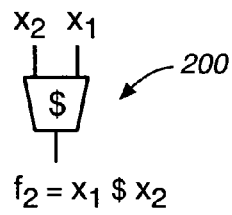
$f_2 = x_1 \$ x_2$
FIG._7
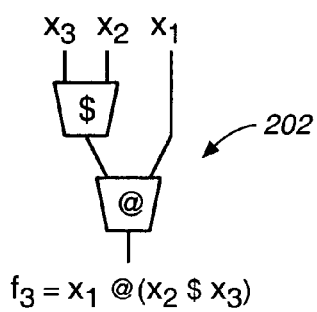
$f_3 = x_1 @ (x_2 \$ x_3)$
FIG._8
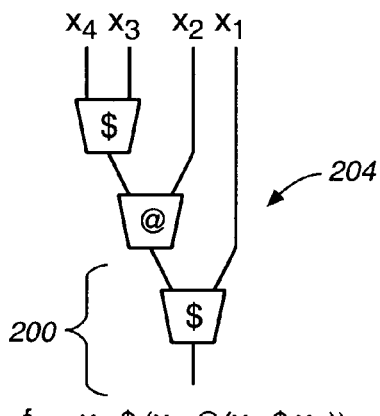
$f_4 = x_1 \$ (x_2 @ (x_3 \$ x_4))$
FIG._9
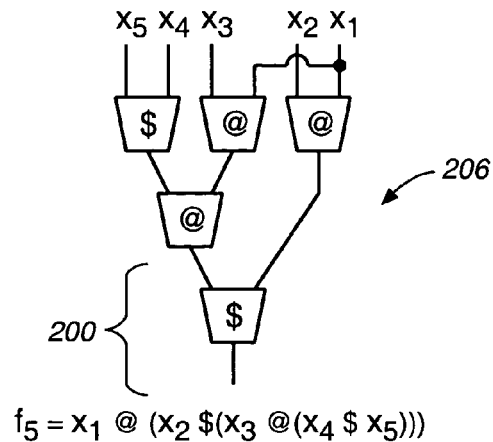
$f_5 = x_1 @ (x_2 \$ (x_3 @ (x_4 \$ x_5)))$
FIG._10
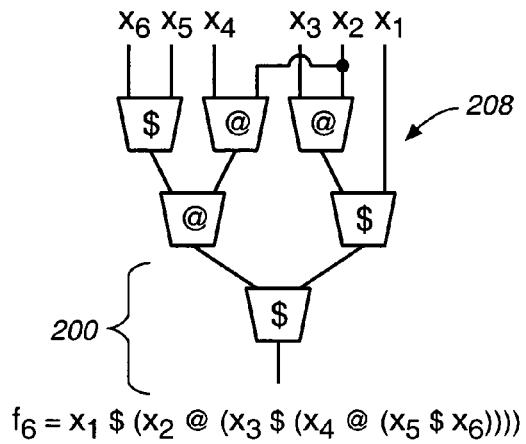
$f_6 = x_1 \$ (x_2 @ (x_3 \$ (x_4 @ (x_5 \$ x_6))))$
FIG._11
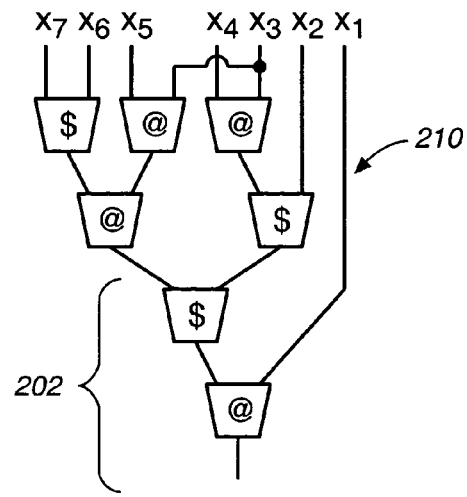
$f_7 = x_1 @ (x_2 \$ (x_3 @ (x_4 \$ (x_5 @ (x_6 \$ x_7)))))$
FIG._12

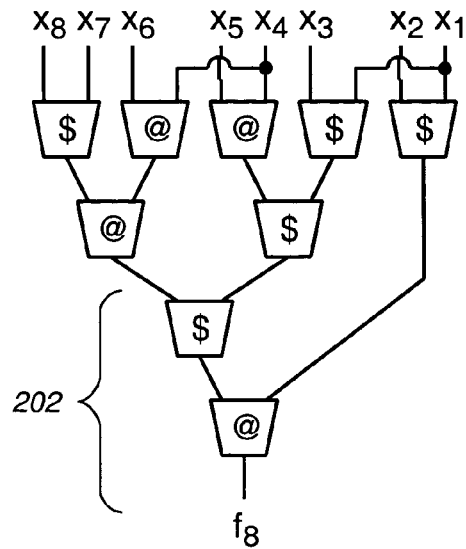
FIG._13
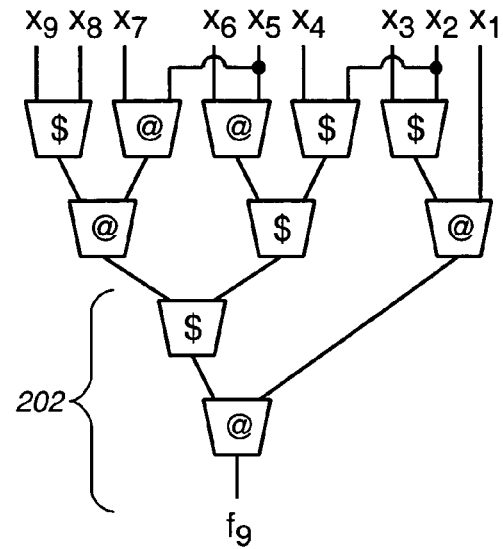
FIG._14
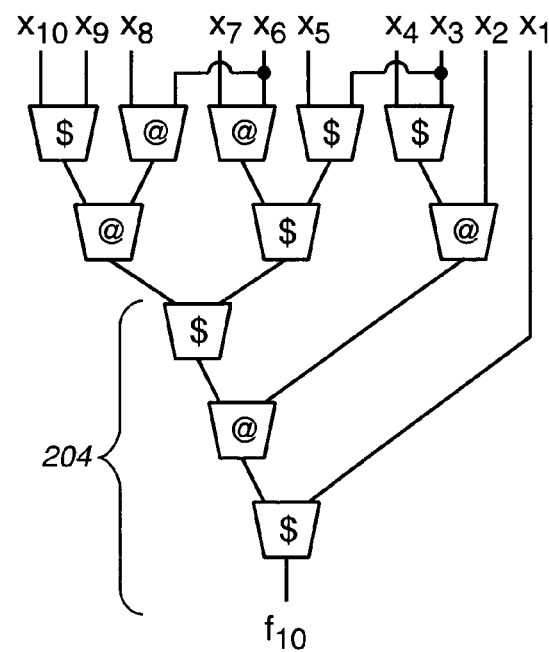
FIG._15

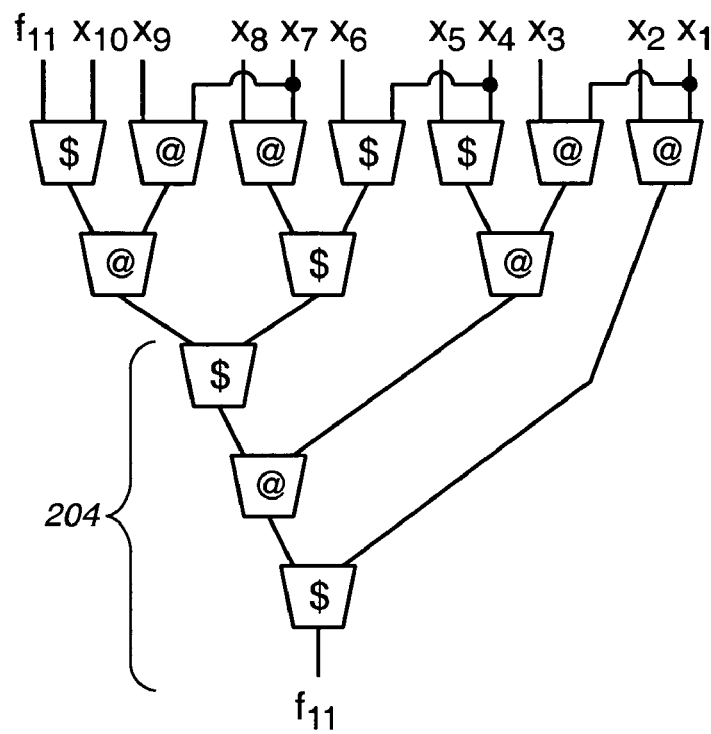
FIG._16
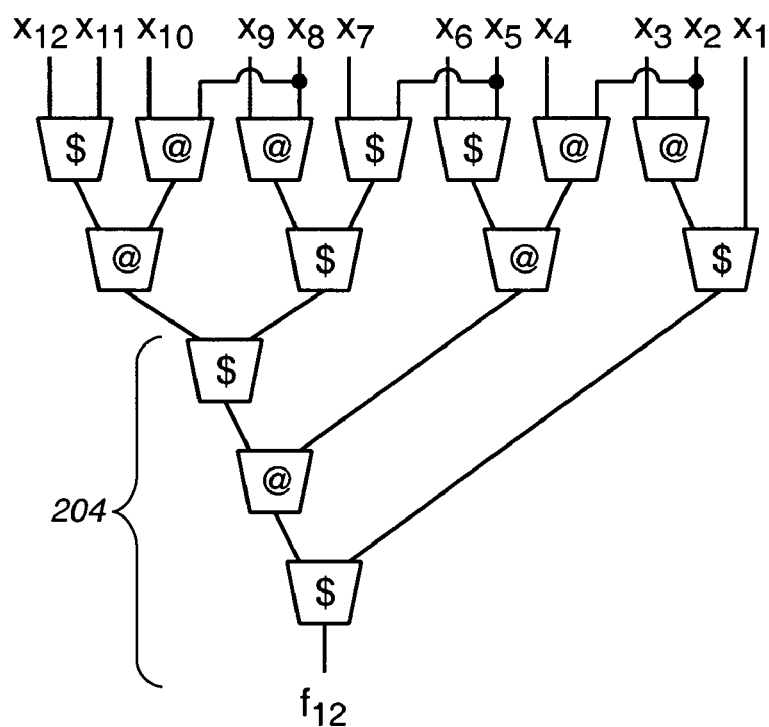
FIG._17

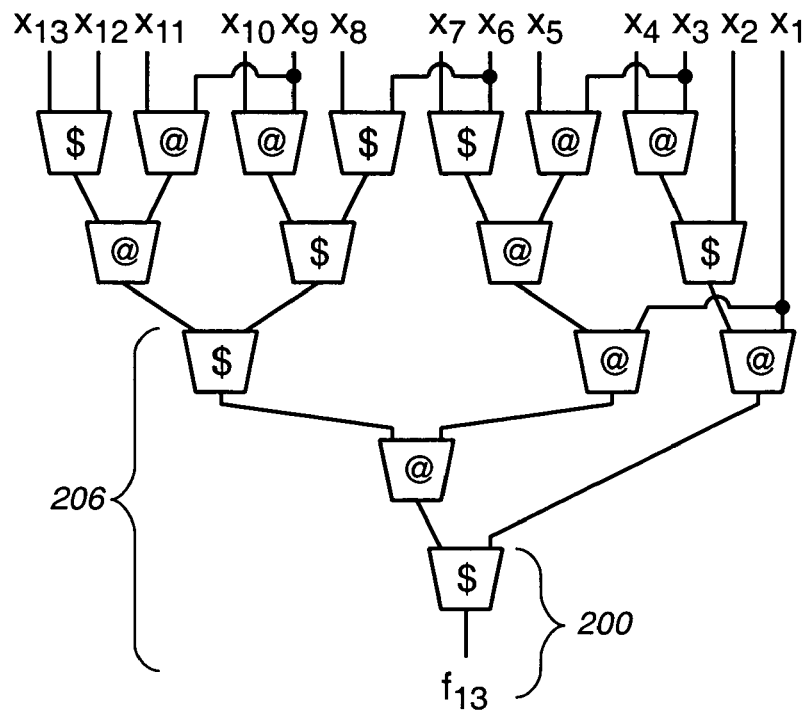
FIG._18
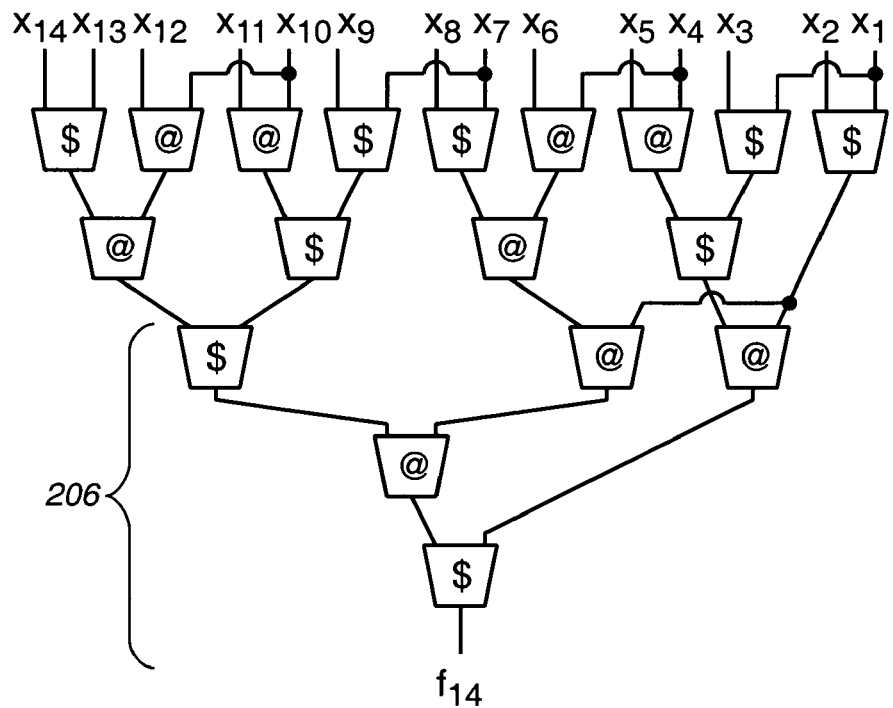
FIG._19

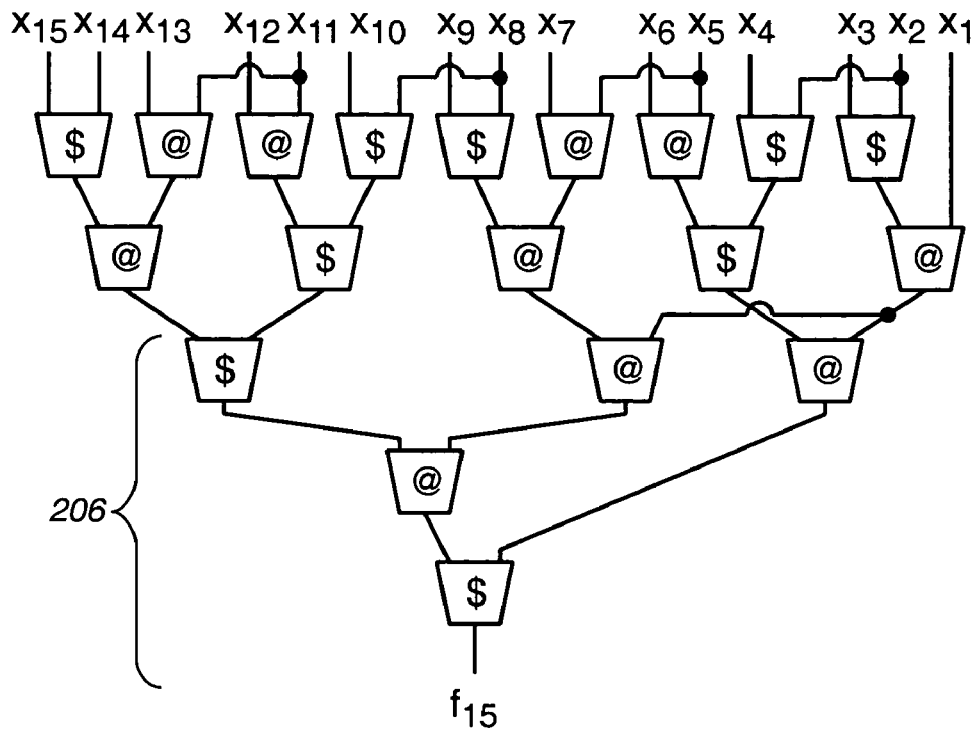
FIG._20
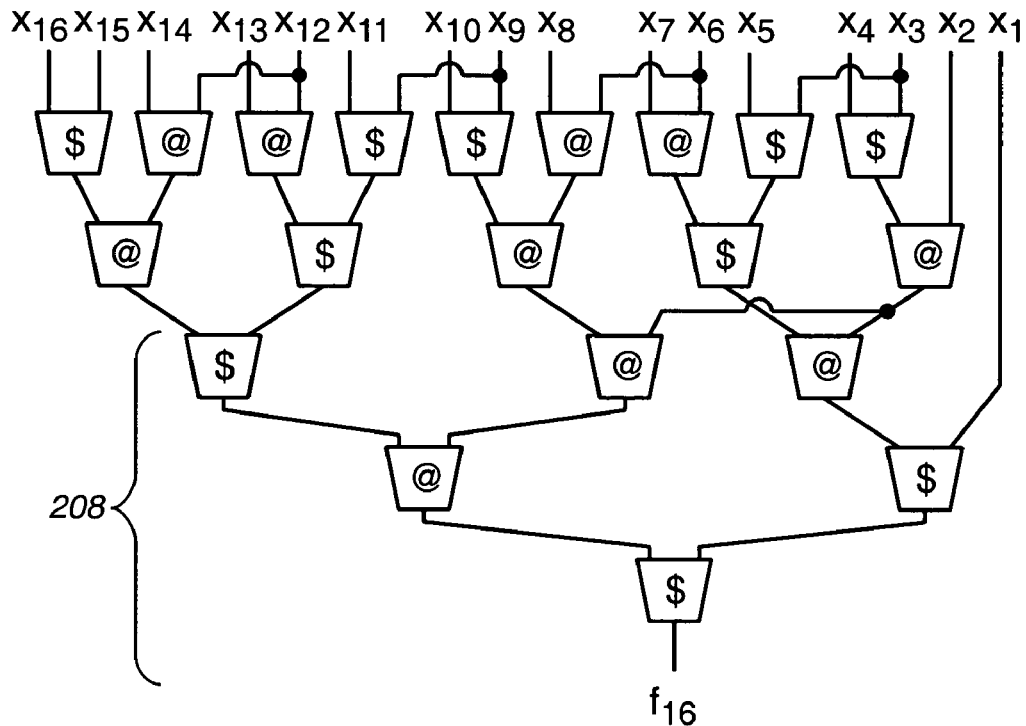
FIG._21

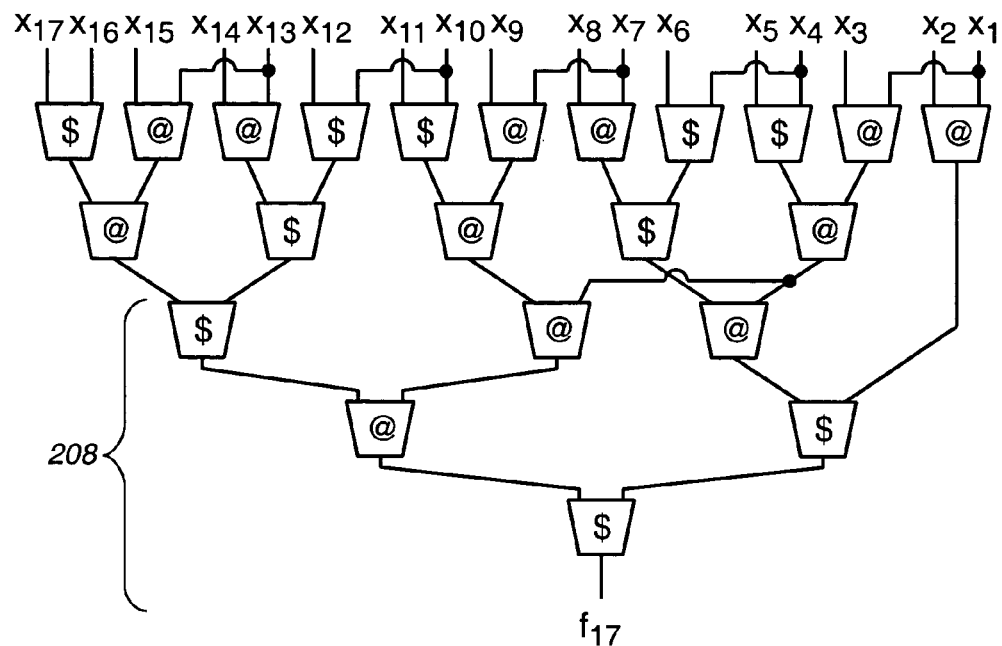
FIG._22
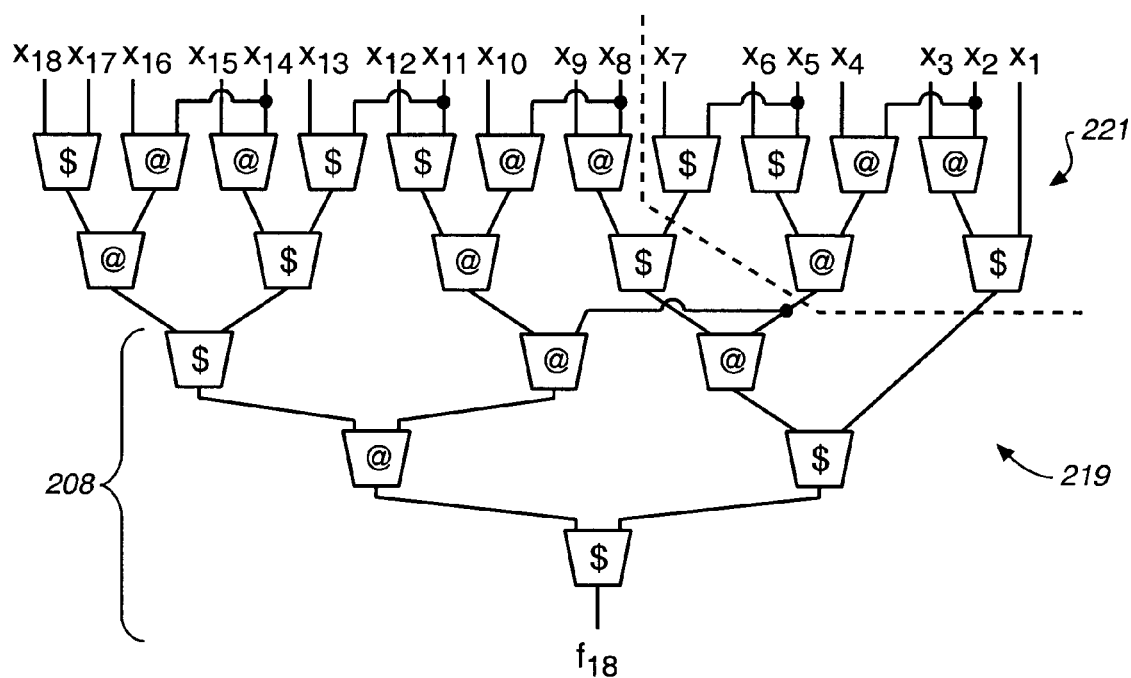
FIG._23

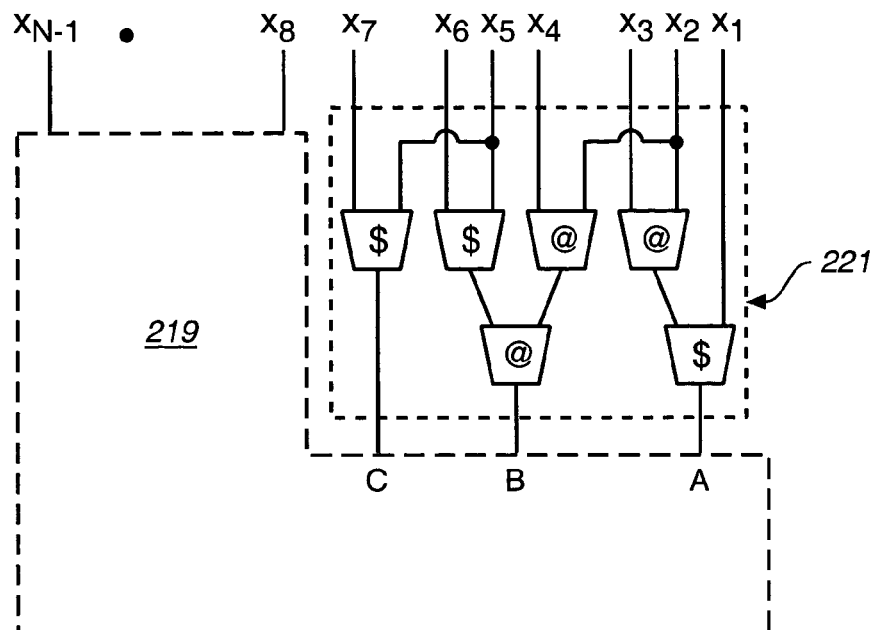
FIG._24
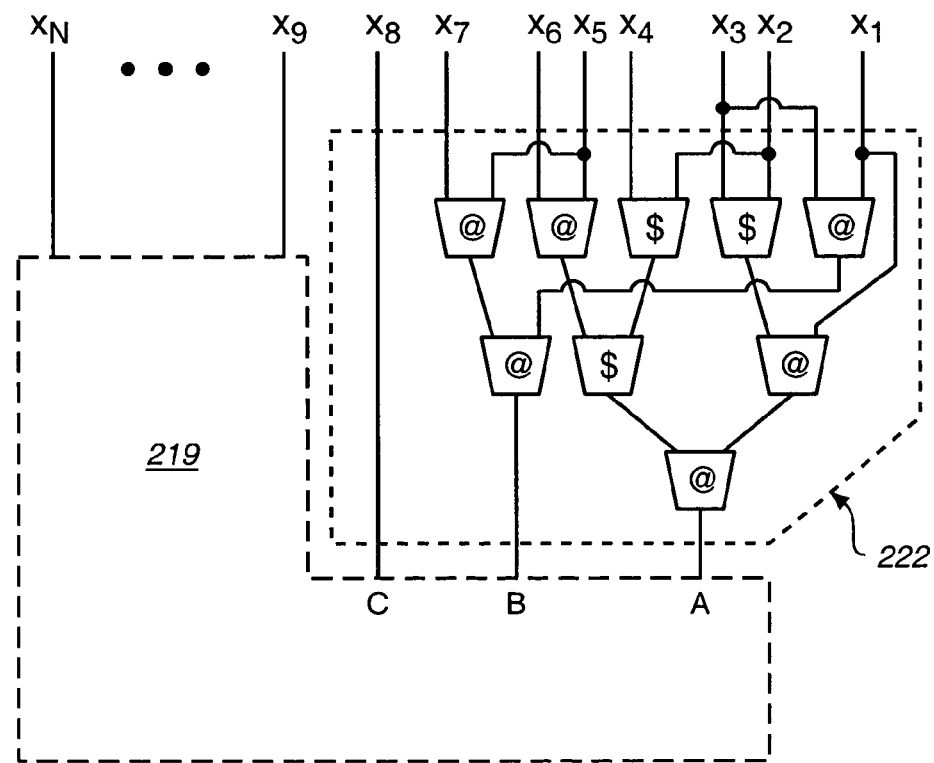
FIG._25

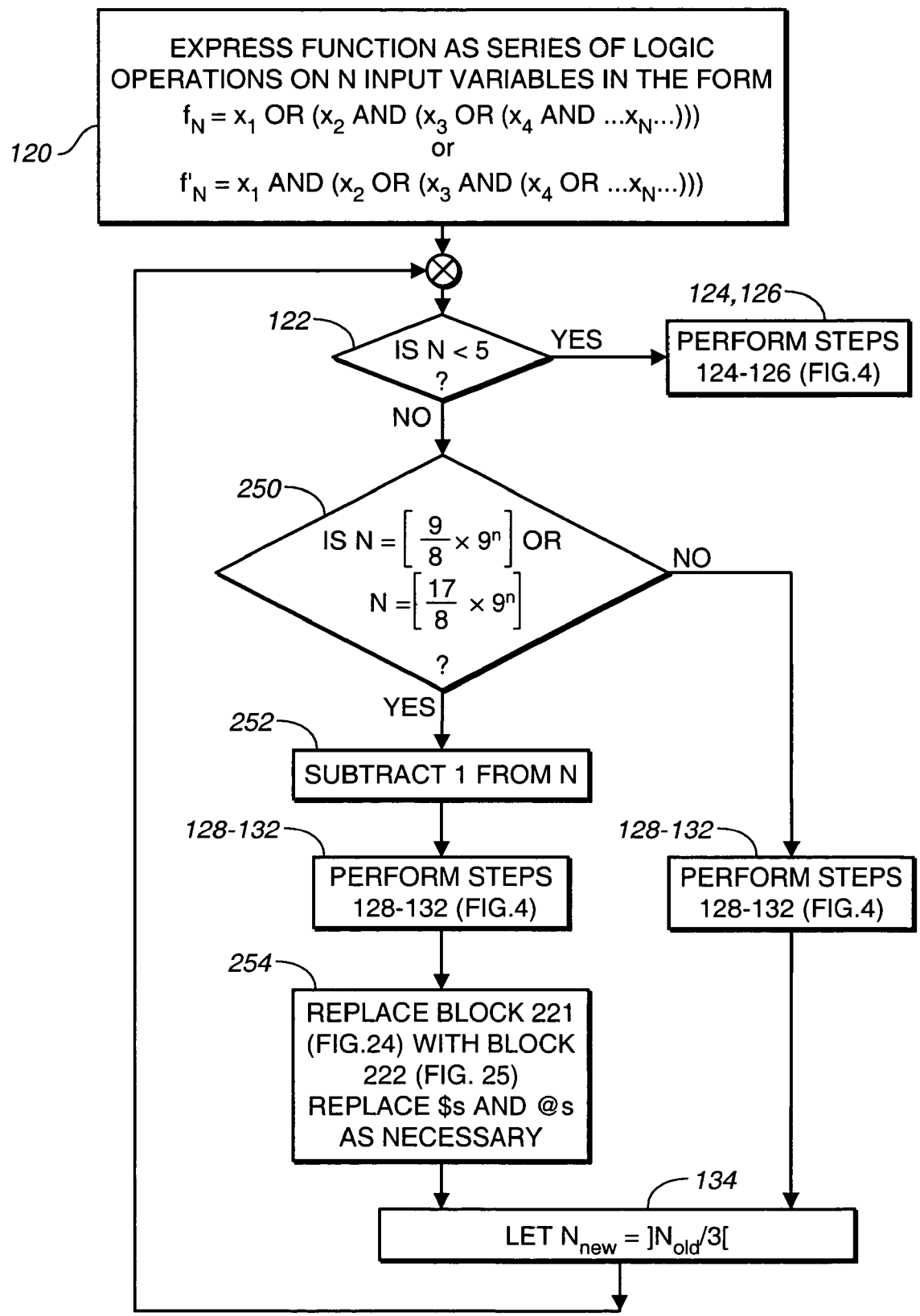
FIG._26

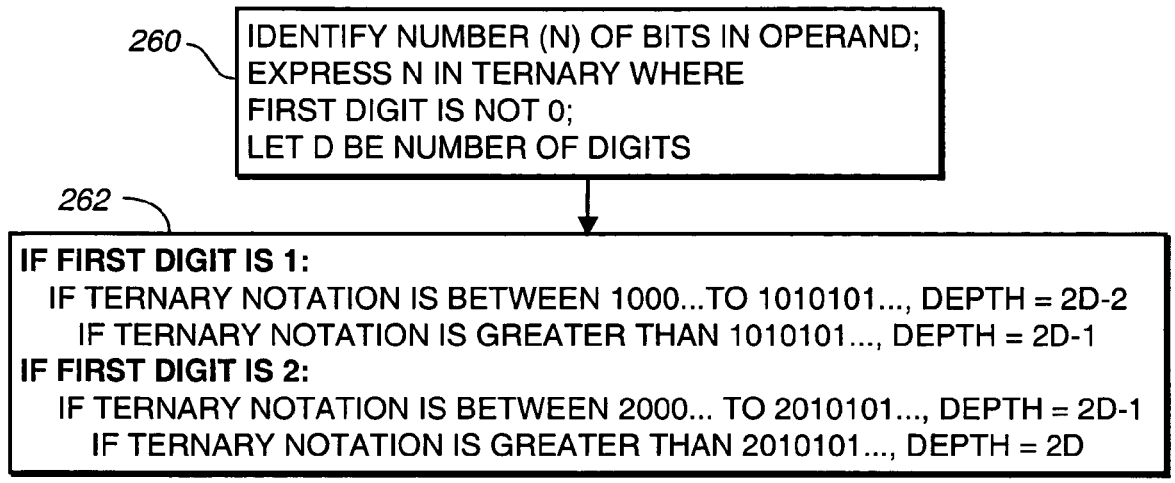
FIG._27
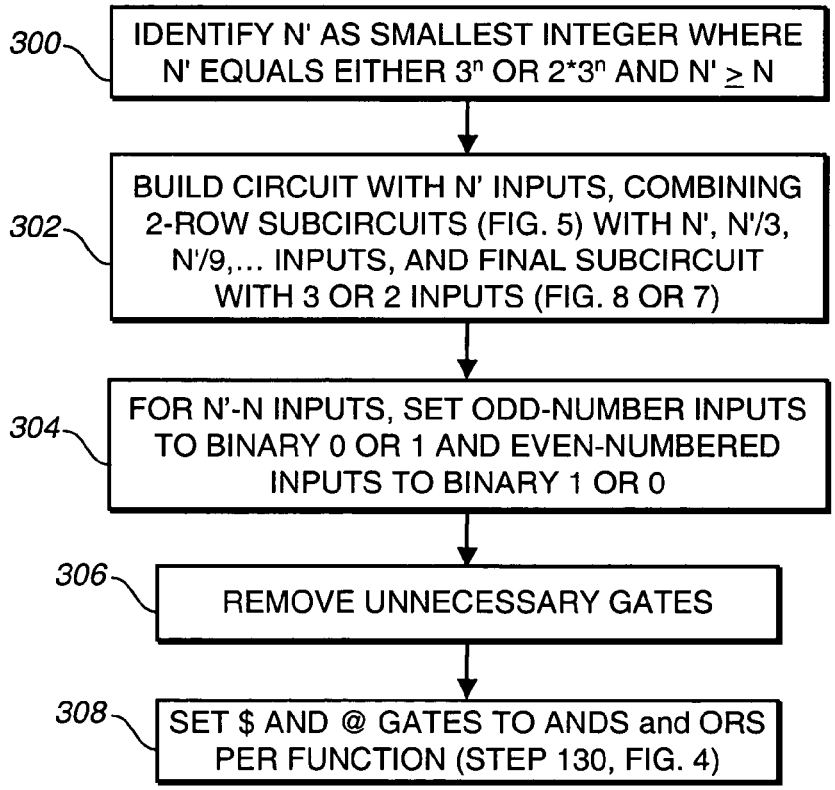
FIG._28

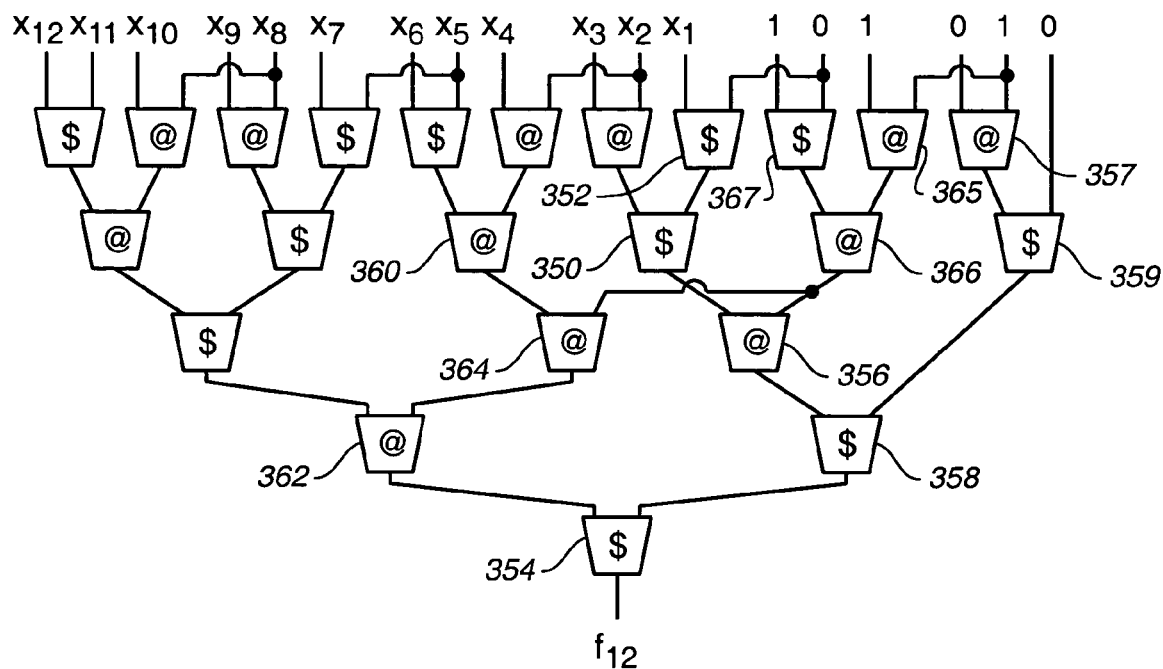
FIG._29

PROCESS FOR DESIGNING COMPARATORS AND ADDERS OF SMALL DEPTH

FIELD OF THE INVENTION

This invention concerns scalable logic circuits, and particularly to scalable comparators and adders of small depth.

BACKGROUND OF THE INVENTION

Two common functions used in the design of logic circuits are:

$$f_N = x_1 \text{ OR}(x_2 \text{ AND}(x_3 \text{ OR}(x_4 \text{ AND} \ldots x_N \ldots ))) \quad (1)$$

and $$f'_N = x_1 \text{ AND}(x_2 \text{ OR}(x_3 \text{ AND}(x_4 \text{ OR} \ldots x_N \ldots ))). \quad (2)$$

These functions are important because they concentrate almost all delay of most frequently used operations, such as addition, subtraction and comparison of (N/2)-bit numbers. Consequently, faster implementation (often referred to as "small depth") of these functions will result in faster adder, subtractor and comparator logic circuits on the resulting integrated circuit (IC) chip. As used herein (unless the context clearly indicates otherwise), "addition" operation includes subtraction operations and "adders" includes subtractors.

To illustrate the effect of these functions, an addition operation of two binary numbers, A and B, may be expressed as:

$$\begin{array}{cccccc}
a[1] & a[2] & a[3] & \cdots & a[N] & + \\
b[1] & b[2] & b[3] & \cdots & b[N] & \\
\hline
s[0]s[1] & s[2] & s[3] & \cdots & s[N] &
\end{array}$$

where a[1], a[2], a[3], a[4], ..., a[N] are the bits of operand A, b[1], b[2], b[3], b[4], ..., b[N] are the bits of operand B, and index 1 corresponds to the most significant bit. The resultant, S, is expressed as bits s[0], s[1], s[2], s[3], ..., s[N], where index 0 corresponds to the most significant bit. This operation can be expressed as $$s[i]=a[i]+b[i]+c[i+1] (\text{mod } 2),$$

where $c[i]$ is the i-th carry bit, i>0, and s[0]=c[1]. The value of c[i] will equal 1 when at least one of the following conditions occurs:
1) (a[i]=1 and b[i]=1);
2) (a[i]=1 or b[i]=1) and
   (a[i−1]=1 and b[i−1]=1);
3) (a[i]=1 or b[i]=1) and
   (a[i−1]=1 or b[i−1]=1) and
   (a[i−2]=1 and b[i−2]=1);
4) (a[i]=1 or b[i]=1) and
   (a[i−1]=1 or b[i−1]=1) and
   (a[i−2]=1 or b[i−2]=1) and
   (a[i−3]=1 and b[i−3]=1);
etc.

If x[i] is substituted for (a[i]=1 and b[i]=1) and y[i] is substituted for (a[i]=1 or b[i]=1), the value of c[i] can be expressed as:
c[i]=x[i] or
    (y[i] and x[i−1]) or
    (y[i] and y[i−1] and x[i−2]) or
    (y[i] and y[i−1] and y[i−2] and x[i−3]) or
    ...
    (y[i] and y[i−1] and y(i−2] and ... and
    y[N−1] and x[N]).

Transformation of the above leads to
    c[i]=x[i] OR (y[i] AND (x[i−1] OR (y[i−1] AND ... AND
    (x[N−1] OR (y[N−1] AND x[N])) ... ))), which is an expression of addition in the form of function (1).

In a comparison operation, A>B is true in the following cases:
1) if a[1]>b[1];
2) if a[1]=b[1] and a[2]>b[2];
3) if a[1]=b[1] and a[2]=b[2] and
   a[3]>b[3];
etc.

(If a greater or equal function ("≧") is used in place of the equality function ("="), the result will be the same, except that the steps are not mutually exclusive.)

If x[i] is substituted for a[i]>b[i] and y[i] is substituted for a[i]=b[i] or a[i]≧b[i], as the case may be, then A>B can be expressed as
    x[i] OR (y[i] AND (x[i−1] OR (y[i−1] AND ... AND
    (x[N−1] OR (y[N−1] AND x[N])) ... ))), which is an expression of comparison also in the form of function (1).

One well-known technique for implementing functions (1) and (2) is illustrated in FIG. 1 using N−1 binary gates 100a, 100b, 100c, ..., 100n. The advantage of this circuit is that it uses the least possible number of gates. The disadvantage of the circuit of FIG. 1 is that it also has a depth of N−1.

The least possible depth for functions (1) and (2) is ($\log_2$ N) (1+o(1)) with not more than const*N gates. See V. M. Krapchenko, "Asymptotic Estimations of Addition Time of Parallel Adder", *Syst. Theor. Res.* 19, pp 105–122 (1970) and M. Minimair, "Design, Analysis and Implementation of an Adder", Ladner & Fisher (1994). However, implementation of this technique is more of a theoretical interest because it becomes efficient only for very large values of N, namely where N is about 3,000 or more. Moreover, for small or average values of N, such as where N is less than about 3,000, this technique requires significantly more than about 1.5N gates for implementation.

An efficient technique for small and moderate values of N (less than about 3,000) is described in U.S. application Ser. No. 10/017792 for "Optimization of Adder Based Circuit Architecture" and U.S. application Ser. No. 10/017802 for "Optimization of Comparator Architecture" both filed Dec. 12, 2001 by Sergej B. Gashkov, Alexander E. Andreev and Aiguo Lu and assigned to the same assignee as the present invention. The Gashkov et al. applications employ a "building block" 102 consisting of two-input AND and OR gates 104a, ..., 104c in the form shown in FIG. 2. Function (1) is implemented as an unbalanced binary tree 106 composed of blocks 102a, ..., 102n, as shown in FIG. 3. Function (2) is implemented by a similar netlist, except the AND gates are replaced with OR gates and vice versa. For an N-input function $f_N$ the Gashkov et al. implementation requires approximately 1.5N binary gates, and has the depth of $\log_t$ N, where "t" is the "golden ratio" of approximately 1.618. Accordingly, the depth of circuits employing the Gashkov et al. technique is about 1.44 $\log_2$ N. (A balanced tree implementation would require the same complexity, but would increase the depth to 2 $\log_2$ N.)

SUMMARY OF THE INVENTION

The present invention is directed to circuits, such as adders and comparators. The circuit (for $f_N$ or $f'_N$) employs approximately 1.5N gates, but with significantly less depth than prior techniques. More particularly, the depth of the circuit is approximately $\log_r N$, where $r=\sqrt{3}$=approximately 1.732. Hence, the depth of the circuit is approximately $1.26 \log_2 N$, compared to approximately $1.44 \log_2 N$ achieved by the Gashkov et al. circuits or N−1 achieved in the circuit of FIG. 1.

A process is provided for implementing a logic circuit for performing logical operations based on a function $f_N = x_1$ OR $(x_2$ AND $(x_3$ OR $(x_4$ AND $\ldots x_N \ldots )))$ or $f'_N = x_1$ AND $(x_2$ OR $(x_3$ AND $(x_4$ OR $\ldots x_N \ldots )))$, where N is selected as the number of inputs to the logic circuit.

In a first embodiment, successive two-row portions of the logic circuit are recursively defined based on a pre-selected pattern of first and second gate types. A top portion has N inputs and ]N/3[ outputs, with inputs to each successive portion being connected to outputs of the prior portion and each portion having one-third the number of outputs. Upon reaching a number of variables less than 5, a bottom level of the circuit is selected based on the number of remaining inputs. The depth of the circuit is computed from the ternary value of N−1 containing D digits, such that the depth is 2D−1 where the first digit of the ternary value is "1" and the depth is 2D where the first digit of the ternary value is "2".

In a second embodiment, smaller depth can be achieved in some cases by designing a circuit for N−1 inputs and transforming the seven most-significant input portion of the circuit to an eight-input portion. Combining this method with that of the first embodiment, the depth can be reduced by 1 in some cases, namely, where the ternary value of N is between 100000 . . . and 101010 . . . and between 200000 . . . and 201010 . . . . The depth is the same as in the first embodiment for all other cases.

In a third embodiment for constructing an N-input circuit (actually, the same as for the first embodiment), the logic circuit is designed with N' inputs, where N'≧N and equals $3^n$ or $2*3^n$. Odd-positioned inputs in the N'−N most significant inputs are set to a first binary value and even-positioned inputs in the N'−N most significant inputs are set to a second binary value. Unnecessary gates are then removed from the design.

Based on the function, the first gate type is set as either logical OR or logical AND gates and the second gate type is set as the other of either logical OR or AND gates.

In other embodiments, the process of the invention is carried out by a computer operating under control of a computer readable program on a computer useable medium for addressing data to design logic circuits for comparators, adders and similar operation.

BRIEF DESCRIPTION OF THE DRAWINGS

FIG. 1 illustrates a prior technique for implementing functions (1) and (2).

FIGS. 2 and 3 illustrate the technique described in the Gashkov et al. applications for implementing functions (1) and (2).

FIG. 4 is a flowchart illustrating a process of transformation of functions (1) and (2) and designing a circuit according to a first embodiment of the invention.

FIG. 5 is a circuit diagram useful in explaining a portion of the process illustrated in FIG. 4.

FIG. 6 is a flowchart illustrating a process of identifying the depth of a circuit for functions (1) and (2) according to the first embodiment.

FIGS. 7–23 are diagrams of circuits implementing functions (1) and (2) useful in explaining the process of FIGS. 4 and 5.

FIGS. 24 and 25 are diagrams of a circuit useful in explaining an implementation of a second embodiment of the present invention.

FIG. 26 is a flowchart of a process according to the second embodiment for construction of the circuit illustrated in FIG. 25.

FIG. 27 is a flowchart illustrating a process of identifying the depth of a circuit according to the second embodiment of the present invention.

FIG. 28 is a flowchart of a process of designing a circuit according to a third embodiment of the present invention.

FIG. 29 is a circuit diagram useful in explaining the process of FIG. 28.

DETAILED DESCRIPTION OF THE PREFERRED EMBODIMENTS

For purposes of explanation, the symbols "@" and "$" denote logical "AND" and "OR", or vice versa, in the expressions; that is, each expression with "@" and "$" will have two interpretations. For example, any of the two identities $$x\$(y@z) = (x\$y)@(x\$z) \qquad (3)$$

or $$x@(y\$z) = (x@y)\$(x@z). \qquad (4)$$

represents both classical distribution laws of binary logic:

$x$ AND$(y$ OR $z) = (x$ AND $y)$ OR$(x$ AND $z)$ and $x$ OR$(y$ AND $z) = (x$ OR $y)$ AND$(x$ OR $z)$.

If N=18, function (1) can be expressed as:

$$\begin{aligned}f_{18}(x_1, \ldots, x_{18}) = &x_1 \text{ OR}(x_2 \text{ AND } (x_3 \text{ OR } (x_4 \text{ AND}(x_5 \\&\text{OR } (x_6 \text{ AND } (x_7 \text{ OR}(x_8 \text{ AND } (x_9 \text{ OR } (x_{10} \text{ AND} \\&(x_{11} \text{ OR } (x_{12} \text{ AND } (x_{13} \text{ OR}(x_{14} \text{ AND } (x_{15} \text{ OR} \\&(x_{16} \text{ AND}(x_{17} \text{ OR } x_{18}))))))))))))))))).\end{aligned} \qquad (5)$$

Applying expressions (3) and (4) to each line of expression (5), $f_{18}(x_1, \ldots, x_{18})$ can be transformed into the form $f_{18}(x_1, \ldots, x_{18}) = x_1$ OR
$((x_2$ AND $x_3)$ OR $((x_2$ AND $x_4)$ AND
$((x_5$ OR $x_6)$ AND $((x_5$ OR $x_7)$ OR
$((x_8$ AND $x_9)$ OR $((x_8$ AND $x_{10})$ AND
$((x_{11}$ OR $x_{12})$ AND $((x_{11}$ OR $x_{13})$ OR
$((x_{14}$ AND $x_{15})$ OR $((x_{14}$ AND $x_{16})$ AND
$(x_{17}$ OR $x_{18}))))))))))))$.

Let:
$b_{-1} = x_1$
$a_2 = x_2$ AND $x_3$  $b_2 = x_2$ AND $x_4$
$a_5 = x_5$ OR $x_6$  $b_5 = x_5$ OR $x_7$
$a_8 = x_8$ AND $x_9$  $b_8 = x_8$ AND $x_{10}$
$a_{11} = x_{11}$ OR $x_{12}$  $b_{11} = x_{11}$ OR $x_{13}$
$a_{14} = x_{14}$ AND $x_{15}$  $b_{14} = x_{14}$ AND $x_{16}$
$a_{17} = x_{17}$ OR $x_{18}$.

Then:
$f_{18}(x_1, \ldots, x_{18}) = b_{-1}$
  OR ($a_2$ OR ($b_2$
  AND ($a_5$ AND ($b_5$
  OR ($a_8$ OR ($b_8$
  AND ($a_{11}$ AND ($b_{11}$
  OR ($a_{14}$ OR ($b_{14}$
  AND $a_{17}$))))))))).
  = ($b_{-1}$ OR $a_2$)
  OR (($b_2$ AND $a_5$)
  AND (($b_5$ OR $a_8$)
  OR (($b_8$ AND $a_{11}$)
  AND (($b_{11}$ OR $a_{14}$)
  OR ($b_{14}$ AND $a_{17}$))))).

The last six lines may be denoted as
$y_1 = b_{-1}$ OR $a_2 = x_1$ OR ($x_2$ AND $x_3$)
$y_2 = b_2$ AND $a_5 = (x_2$ AND $x_4)$ AND ($x_5$ OR $x_6$)
$y_3 = b_5$ OR $a_8 = (x_5$ OR $x_7)$ OR ($x_8$ AND $x_9$)
$y_4 = b_8$ AND $a_{11} = (x_8$ AND $x_{10})$ AND ($x_{11}$ OR $x_{12}$)
$y_5 = b_{11}$ OR $a_{14} = (x_{11}$ OR $x_{13})$ OR ($x_{14}$ AND $x_{15}$)
$y_6 = b_{14}$ AND $a_{17} = (x_{14}$ AND $x_{16})$ AND ($x_{17}$ OR $x_{18}$).

The number of y's (in this case, 6) is one-third the number of x's (18), and each y can be produced by a circuit of depth 2. Consequently, $$f_{18}(x_1, \ldots, x_{18}) = f_6(y_1, y_2, y_3, y_4, y_5, y_6)$$
$$= y_1 \text{ OR } (y_2 \text{ AND } (y_3 \text{ OR }$$
$$(y_4 \text{ AND } (y_5 \text{ OR } y_6)))).$$

Applying the same transformation again:

$$f_6(y_1, \ldots, y_6) = y_1 \text{ OR } (y_2 \text{ AND } (y_3 \text{ OR } (y_4 \text{ AND } (y_5 \text{ OR } y_6))))$$
$$= y_1 \text{ OR } ((y_2 \text{ AND } y_3) \text{ OR } ((y_2 \text{ AND } y_4)$$
$$\text{AND } (y_5 \text{ OR } y_6)))$$
$$= y_1 \text{ OR } (y_2 \text{ AND } y_3) \text{ OR } ((y_2 \text{ AND } y_4)$$
$$\text{AND } (y_5 \text{ OR } y_6))$$
$$= [y_1 \text{ OR } (y_2 \text{ AND } y_3)] \text{ OR } [(y_2 \text{ AND } y_4)$$
$$\text{AND } (y_5 \text{ OR } y_6)]$$
$$= [y_1 \text{ OR } (y_2 \text{ AND } y_3)] \text{ OR } [(y_2 \text{ AND } y_4)$$
$$\text{AND } (y_5 \text{ OR } y_6)].$$

The two lines of $f_6(y_1, \ldots, y_6)$ may be denoted as
$z_1 = y_1$ OR($y_2$ AND $y_3$)

and $z_2 = (y_2$ AND $y_4)$ AND($y_5$ OR $y_6$), so $f_6(y_1, \ldots, y_6) = f_2(z_1, z_2) = z_1$ OR $z_2$.

Again, the number of z's (2) is 3 times less than the number of y's (6), but the computation adds 2 more units of depth.

FIG. 4 is a flowchart illustrating a circuit design process according to a first embodiment. At step 120, the function is expressed in the form $f_N = x_1$ OR($x_2$ AND($x_3$ OR($x_4$ AND ... $x_N$ ... )))

or $f'_N = x_1$ AND($x_2$ OR($x_3$ AND($x_4$ OR ... $x_N$ ... ))), where AND and OR represent two-input AND and OR gates, respectively, and N is the number of inputs. At step 122, if N<5, the process continues to step 124 where a netlist is selected in terms of $ and @ gates from the version illustrated in one of FIGS. 7–9 having N inputs. At step 128, the $s and @s are converted to ORs or ANDs based on the function $f_N$ or $f'_N$ and the parity of N and the process is completed.

If at step 122 N≧5, then at step 128, each group of three successive variables is transformed using distribution laws (3) and (4). More particularly, at step 128 each (for M=N–4, N–7, N–10, ... ) group in the form ($x_M$ AND ($x_{M+1}$ OR ($x_{M+2}$ AND Z))) is transformed to $a_M$ OR ($b_M$ AND Z), where $a_M = x_M$ AND $x_{M+1}$ and $b_M = x_M$ AND $x_{M+2}$, and each group in the form ($x_M$ OR ($x_{M+1}$ AND ($x_{M+2}$ OR Z))) is transformed to $a_M$ AND ($b_M$ OR Z), where $a_M = x_M$ OR $x_{M+1}$ and $b_M = x_M$ OR $x_{M+2}$, and Z represents the trailing portion of the expression for $f_N$ or $f'_N$ containing the remaining terms $x_{M+3} \ldots x_N$. At step 130, $c_M$ is defined as $c_M = b_M$ AND $a_{M+3}$ or $c_M = b_M$ OR $a_{M+3}$, depending on whether the relationship $b_M$ AND Z or $b_M$ OR Z is employed at step 128. At step 132 a portion of the netlist, composed of two rows, is created in the form of FIG. 5, such that $a_i$ and $b_i$ are implemented in the first row and $c_i$ is implemented in the second row. The netlist portion has ]N/3[ outputs, which are inputs of the next ]N/3[-input function, also of the form (1) or (2). Thus at step 134, a new value of N is identified equal to one-third (rounded up) of the old value of N: $N_{new} = ]N_{old}/3[$, and the process returns to block 122.

The process is a recursive process that reduces parameter N to ]N/3[ for each successive iteration, until 1 to 4 variables remain. When less than five variables remain (N<5) at step 122, a bottom level portion of the netlist is selected at step 124 and converted to ORs or ANDs at step 126, based on the function $f_N$ or $f'_N$ and the parity of N. More particularly, on each successive iteration back to step 122, there are about one-third the number of variables as in the prior iteration. Thus, the value of N for each successive iteration is one-third the value of N (rounded up) of the just-completed iteration. The process continues, creating successive two-row portions of the netlist during each iteration, until N<5 at step 122, whereupon one of the circuits of FIGS. 7–9 forms the bottom row(s) of the netlist. If, at step 122, N=1, no additional lower rows need to be added, whereupon the process simply continues to step 126 and ends.

At step 126, the $ and @ gates are converted to AND and OR gates to complete the circuit design for the function. This is performed by examining the left-most gate in the circuit (namely, the gate receiving the two least-significant bits, $x_N$ and $x_{N-1}$) and setting that gate to the appropriate logic operation for the function. For example, if the function requires that the least-significant be ORed, the least-significant gate receiving $x_N$ and $x_{N-1}$, which is $ gate 110 in block 140 of FIG. 5, and all other $ gates are set to OR functions and all @ are set to AND functions.

During each iteration of step 132 (FIG. 4), two rows of gates are designed using blocks 140 and 142 in FIG. 5. In FIG. 5, block 140 has two inputs and each block 142 has up to six "outer" inputs plus one "internal" input. For purposes of illustration, the least-significant input bit, $x_N$, is the left-most bit and the most-significant bit, $x_1$, is the right-most input. Therefore, blocks 140 and 142 are arranged so that block 140 receives 2 least-significant bits, block 142a receives the next 6 more-significant bits, block 142b receives the next 6 more-significant bits, etc. (but the last block in the sequence may receive less than 6 bits, depending on N mod 6; also, the last block has no "internal" inputs). The completed structure has N inputs and ]N/3[ outputs. Thus, if N=10, 11, or 12, there are 4 outputs.

Block 140 comprises a two-input $ gate 110 in the uppermost row and a two-input @ gate 112 in the second row. As previously noted, each $ and @ gate is either a logical OR or AND gate and the $ and @ gates are logically different. Thus, if the $ gates are OR gates, then the @ gates are AND gates, and vice versa. The inputs to the $ gate 110 of block 140 are coupled to the two least-significant bits of the input, and the output of the $ gate 110 is coupled to one input of @ gate 112 of block 140.

Each block 142 has up to six inputs with two two-input @ gates 112 and two two-input $ gates 110 in the first level, coupled so that a first @ gate 112a receives the first and third least-significant bits to the block and a second @ gate 112b receives the second and third least-significant bits to the block. A first $ gate 110a receives the fourth least and the most-significant bits to the block and a second $ gate 110b receives the fifth least and the most-significant bits to the block. The output of the first @ gate 112a is coupled to the second input of the second row @ gate 112 in the more-significant block (i.e., to the @ gate 112 in block 140 from block 142a or the second row @ gate 112c in block 142a from block 142b). The outputs from the second @ gate 112b and first $ gate 110a are input to a $ gate 110c in the second level of block 142, and the output from the second $ gate 110b is input to one input of a @ gate 112c in the second level of block 142. The second input to the second level @ gate 112c in block 142 is coupled to an input where N is either 9 or 10 (see FIGS. 14 and 15), or to the output of a first level @ gate of a next higher-significant block or partial block 142b (see FIGS. 16–23, where N≧11).

The top two levels of the circuit are composed of a block 140 and one or more blocks or portions of blocks 142 as necessary to achieve N inputs. However if N=1, no gate is necessary and the function is satisfied with a wire (depth=0). If N=2, only the $ gate 110 of block 140 is used. In all other cases, a block 140 of $ gate 110 and @ gate 112 is employed.

In the case of multiple blocks 142, only the block 142 (such as block 142b shown in FIG. 5) receiving the most significant inputs might have less than six inputs. Thus, blocks 142 are employed in six configurations: One configuration, used when there are three inputs to the block 142, employs two first-level @ gates 112. Second and third configurations, used when there are four or five inputs to the block, employ two first-level @ gates and a second-level $ gate 110 receiving the output of the most-significant @ gate and the most-significant input. A fourth configuration, used when there are six inputs to the block, employs the two first-level @ and $ gates and the second-level $ gate. Fifth and sixth configurations, used when there are six inputs to the block and one or two additional more-significant inputs, employ the full block, with one of the two more-significant inputs being applied to the second level @ gate. Examples of these configurations are illustrated in FIGS. 10–15, respectively.

At step 128, after completion of the iterations and reduction of the number of variables to less than 5, the lower rows are added to the design in a format that is the same as a smaller circuit design. More particularly, the number of outputs from the second row is identified, and the circuit design having that number of inputs is coupled to the outputs from the second row to complete the design. For example, the two lowest levels of the 7-input circuit of FIG. 12, 8-input circuit of FIG. 13 and 9-input circuit of FIG. 14 are a copy of the 3-input circuit 182 of FIG. 8; the two lowest levels of the 10-input circuit of FIG. 15, 11-input circuit of FIG. 16 and 12-input circuit of FIG. 17 are a copy of the 4-input circuit 184 of FIG. 9; etc.

FIG. 6 is a flowchart illustrating the process of identifying the depth of a circuit for performing functions (1) and (2) having a given value of N. It will be appreciated from the above, two important sequences of values of N can be derived. Where $N=2*3^n$ and n is a positive integer equal to or greater than zero ($n \geq 0$), function $f_N$ can be implemented with depth 1+2n, that is, $$1+2 \log_3(N/2)$$

$$=\log_r N+1-\log_3 4$$

$$\sim \log_r N-0.26$$

(where $r=\sqrt{3}$). Thus, the depths of the circuits with these functions can be evaluated as:

$f_2$ with depth 1,
$f_6$ with depth 3,
$f_{18}$ with depth 5,
$f_{54}$ with depth 7,
$f_{162}$ with depth 9,
etc.

The second important sequence arises where $N=3^n$, where in general function $f_N$ can be implemented with a depth of 2n, that is, $$2 \log_3 N = \log_r N.$$

Thus, the depths of circuits with these functions can be evaluated as:

$f_1$ with depth 0, because $f_1(x_1)=x_1$
$f_3$ with depth 2, because $f_3(x_1, x_2, x_3)=x_1$ OR $(x_2$ AND $x_3)$
$f_9$ with depth 4,
$f_{27}$ with depth 6, etc.

At step 150, the number N of bits in the function of the form (1) or (2) is identified, and the number N−1 is expressed in ternary notation, where the first digit is not 0 (is either "1" or "2").

At step 152, the depth of a circuit is selected from a table based on the ternary notation of N−1 (where the first digit is not 0). More particularly, for any number of digits in the notation, if the first digit of the ternary notation is "1", the depth is 2D−1, where D is the number of digits in the ternary notation. If the first digit of the ternary notation is "2", the depth is 2D. Consider a range of inputs between N=28 and N=81, then N−1 is between 27 and 80 (which is the range of ternary notations between 1000 and 2222). If the number N of bits is between 28 (N−1=1000 in ternary) and 54 (N−1=1222 in ternary), the circuit can be implemented with a depth of 7 (D=4, so 2D−1=7). For N−1=54–80 (ternary 2000 to 2222) the circuit can be implemented with a depth of 8 (D=4, so 2D=8). Stated another way, the depth of the circuit is $$2n, \text{ if } 3^n < N \leq 2*3^n,$$

$$2n+1, \text{ if } 2*3^n < N \leq 3^{n+1},$$

where n is an integer.

FIGS. 7–23 illustrate implementations of circuit layouts performing the respective functions $f_2 \ldots f_{18}$ or $f'_2 \ldots f'_{18}$ (again, with the most-significant bit, $x_1$, input to the right-most input and the least-significant bit, $x_N$, input to the left-most input). In each case, "$" is an "OR" or "AND" logical operation as between two variables in the corresponding function (1) or (2). "@" is the remaining operation. Thus, each "$" may represent a two-input OR gate 110 and each "@" may represent a two-input AND gate 112, or vice versa. FIG. 7 illustrates an implementation for $f_2$ or $f'_2$ where N=2. The circuit is implemented in a single $ gate 110 to perform the function $f_2=x_1 \$ x_2$ with a depth of 1. In FIG. 8, N=3, which is implemented by $ gate 110 and @ gate 112 in the form of block 140 (FIG. 5) for the function $f_3=x_1$ @ $(x_2 \$ x_3)$ with depth of 2.

The first two levels of the circuits expand with increasing inputs (increasing values of N) as described above in connection with FIGS. 4 and 5. As the number of inputs (N) increases, the circuit structure incorporates output levels that are identical to less complex structures. Thus, the circuits of FIGS. 9–11 incorporate a one-level output at the third level that is the same as first level of FIG. 7, FIGS. 12–14 incorporate a two-level output at the third and fourth levels that is the same as the first two levels of FIG. 8, FIGS. 15–17 incorporate a three-level output that is the same as FIG. 9, FIGS. 18–20 incorporate a three-level output that is the same as FIG. 9, FIGS. 21–23 incorporate a three-level output that is the same as FIG. 10, etc.

For larger Ns, the circuit is implemented by constructing the two uppermost levels, left to right, as shown in FIG. 5. The structure periodically repeats after each six inputs. For example, compare the two uppermost levels for inputs $x_1$ to $x_{11}$ in FIG. 16 and the two uppermost levels for inputs $x_7$ to $x_{17}$ in FIG. 22; compare the two uppermost levels for inputs $x_1$ to $x_{12}$ in FIG. 17 and the two uppermost levels for inputs $x_8$ to $x_{18}$ in FIG. 23, etc. There can be six different gate patterns at the right end of each structure, each of the six different gate patterns being a respective portion (starting at the left) of the six-input block 142 (FIG. 5).

The lower levels are copies of smaller structures based on the number of inputs to the third level. More particularly, if the third level has two inputs, the lower level(s) is a copy of the structure of FIG. 7, if the third level has three inputs, the lower level(s) is a copy of the structure of FIG. 8, etc. More particularly, it will be appreciated that the lowest levels of each circuit is one of three forms: circuit 200 with two inputs (see FIGS. 10, 11 and 18–23), circuit 202 with three inputs (see FIGS. 12–14) and circuit 204 with four inputs (see FIGS. 15–17.

Computer analysis reveals that the process described herein provides optimal (minimum depth) implementation (for netlists containing only 2-input AND and OR gates) for N≦9, 11≦N≦18 and for 20≦N≦27. Better implementations exist for N=10, 19 and 28–30.

In some circumstances (for example if N=10, 19, 28–30), it is possible to reduce the depth of the circuit by 1 using a modification of the algorithm just described. More particularly, if, during a recursive operation, parameter N is expressed in ternary notation as 101, 201, 10101, 20101, 1010101, 2010101, etc. (which in decimal notation is N=10, 19, 91, 172, 820, 1549, . . . ), then in accordance with a second embodiment of the invention, an N-input circuit can be constructed from a transformation of an (N−1)-input circuit. FIG. 24 illustrates the general case of a circuit having N−1 inputs, where N is one of these numbers. Examples of FIG. 24 include FIGS. 14 and 23, where N=9, N=18, . . . . These circuits (represented by FIG. 24) may be transformed to a circuit having N inputs, shown in FIG. 25, without increasing depth, if the primary input of point A in FIG. 24 is not depth-critical, that is, the depth of inputs to point A may be increased from 2 to 3 without increasing the total depth of the circuit. Examples of these circuits are illustrated in FIGS. 14 and 23. Circuits (generated by algorithms of the present invention) having 10, 19, 91, 172, etc. inputs all satisfy this condition, allowing the transformation to be applied. If the design rules for the circuit under design are such that the depth of inputs to point A cannot be increased, the option of FIGS. 24–26 is not available and the circuit having N inputs is implemented as described in conjunction with FIG. 4.

In FIG. 24, the circuit for N−1 includes a portion 219 having three inputs A, B and C from the circuit portion 221. In the transformation process, described in conjunction with FIG. 26, circuit portion 222 (FIG. 25) will be substituted for circuit portion 221 to transform the circuit of FIG. 24 to that of FIG. 25.

FIG. 26 is a flowchart illustrating the process of creating circuits of reduced depth where the number of inputs N is expressed in ternary notation as 101, 201, 10101, 20101, 1010101, 2010101, etc. It will be appreciated that each of these cases represents a rounding down of $$\left(\frac{9}{8}\right)*9^n \text{ or } \left(\frac{17}{8}\right)*9^n,$$

where n is an integer. (The value of N is given by rounded down these expressions to the nearest integer. Thus, where n=1, $$\left(\frac{9}{8}\right)*9^n$$

gives a value of 10⅛ and $$\left(\frac{17}{8}\right)*9^n$$

gives a value of 19⅛, then values are rounded to N=10 and N=19.) The process of FIG. 26 starts with the expression of function $f_N$ or $f'_N$ at step 120, as in FIG. 4. If N<5 at step 122, then steps 124–126 are performed as in the case of FIG. 4. If N≧5, the process continues to step 250. If the ternary value N is not one of the notations 101, 201, 10101, 20101, 1010101, 2010101, etc. (i.e., if N is not a rounding down of $$\left(\frac{9}{8}\right)*9^n \text{ or } \left(\frac{17}{8}\right)*9^n$$

to the next lower integer value), the process continues to steps 128–134, as in FIG. 4, recursively building two-row portions of the netlist during each iteration 256 as previously described. If no iteration examines one of the ternary values of N identified as 101, 201, 10101, 20101, 1010101, 2010101, etc., the process is the same as that described in FIG. 4.

However, if at step 250 the ternary notation of N is one of 101, 201, 10101, 20101, 1010101, 2010101, etc. (i.e., if N is a rounding down of $$\left(\frac{9}{8}\right)*9^n \text{ and } \left(\frac{17}{8}\right)*9^n,$$

then at step 252 1 is subtracted from N, setting the parameter to N−1, and steps 128–132 of FIG. 4 are executed to create two rows of the netlist as previously described. At step 254, the (N−1)-input netlist is transformed as described in connection with FIGS. 24 and 25 to convert a small portion of the (N−1)-input netlist, connected to the seven most-significant inputs, to another structure with one more input, that makes total of N inputs. The $ and @ gates are changed to OR and AND gates as necessary.

As shown in FIG. 24, the (N−1)-input circuit includes a circuit portion 221 composed of two top levels of gates for the seven right-most (most-significant) inputs (I−1) $x_1, \ldots, x_7$. At step 254, circuit 221 (FIG. 24) is replaced with the special circuit 222 shown in FIG. 25. The special circuit has 8 inputs (I) $x_1, \ldots, x_8$ to replace the seven inputs (I−1) $x_1, \ldots, x_7$ of circuit 221. Remaining inputs $x_8, \ldots, x_{N-1}$ of the (N−1)-input circuit are renamed as $x_9, \ldots, x_N$, respectively.

If the circuit of FIG. 24 will compute the function $f_{N-1}$ or $f'_{N-1}$, then the circuit of FIG. 25 will compute function $f'_N$ or $f_N$, respectively. Nevertheless, the gate associated with two least significant bits ($x_N$ and $x_{N-1}$) is assigned an OR or AND function, based on the function being performed, and all like gates are similarly designated. Thus, if that gate is a @ gate it will be designated an OR gate to perform function (1) and all @ gates become OR gates and all $ gates become AND gates.

Finally, at step 134 a new value of N is set to one-third the old value of N (rounded up) as described in FIG. 4, and the process returns to step 122.

FIG. 27 is a flowchart illustrating the process of computing the depth of a circuit design for a circuit designed according to the process of FIG. 26. At step 260, the number N of bits in a the function of the form of (1) or (2) is identified, and the value of N is expressed in ternary notation, where the first digit is not 0 (is either "1" or "2").

At step 262, the depth of a circuit constructed by the process of FIG. 26 is selected from a table based on the ternary notation of N (where the first digit is not 0). More particularly, for any number D of digits in the ternary notation, if the first digit of the ternary notation of N is "1", the depth of the circuit is 2D−2 if the notation is of the form between 1000000 . . . and 1010101 . . . , and the depth of the circuit is 2D−1 if the ternary notation is of the form greater than 1010101 . . . . For example, if N=3, the ternary notation is "10" and the depth is 2. If N=4, the notation is "11" and the depth is 3.

If the first digit of the ternary notation of N is "2", the depth is 2D−1 if the notation is of the form between 2000000 . . . and 2010101 . . . , and is 2D if the notation is of the form greater than 2010101 . . . . For example, consider the range of ternary notations between 1000 and 2222 (which is a range of N between 27 and 80). If the number N is 27 (1000 in ternary), the circuit with 27 inputs can be implemented with a depth of 6 (D=4, so 2D−2=6). Likewise, where N is 28, 29 or 30 (ternary 1001, 1002 and 1010) the circuit can be implemented with a depth of 6. For N=31 to N=53 (ternary 1011 to 1222), the circuit can be implemented with a depth of 7 (D=4, so 2D−1=7). For N=54–57 (ternary 2000 to 2010) the circuit can be implemented with a depth of 7 (D=4, so 2D−1=7). For N=58–80 (ternary 2011 to 2222), the circuit can be implemented with a depth of 8 (D=4, so 2D=8). Stated another way, the depth of the circuit is $2n$, if $3^n < N \leq 3^n + 3^{n-2} + 3^{n-4} + \ldots$ , $2n+1$, if $3^n + 3^{n-2} + 3^{n-4} + \ldots < N \leq 2 \cdot 3^n + 3^{n-2} + 3^{n-4} + \ldots$ , $2n+2$, if $2 \cdot 3^n + 3^{n-2} + 3^{n-4} + \ldots < N \leq 3^{n+1}$, where n is an integer.

As proof of the special circuit construction consider the tabular definition of function (1), $f = f_N$ (where "*" are don't care values, and underlined digits $\underline{0}$ and $\underline{1}$ refer to values that need to be reversed for the case of an even N):

TABLE 1

| $x_1 \ldots x_N$ |
|---|
| f(1, *, *, *, *, *, *, *, ..., *, *, *, *, *) = 1 |
| f(0, 0, *, *, *, *, *, *, ..., *, *, *, *, *) = 0 |
| f(0, 1, 1, *, *, *, *, *, ..., *, *, *, *, *) = 1 |
| f(0, 1, 0, 0, *, *, *, *, ..., *, *, *, *, *) = 0 |
| f(0, 1, 0, 1, 1, *, *, *, ..., *, *, *, *, *) = 1 |
| f(0, 1, 0, 1, 0, 0, *, *, ..., *, *, *, *, *) = 0 |
| f(0, 1, 0, 1, 0, 1, 1, *, ..., *, *, *, *, *) = 1 |
| ... |
| f(0, 1, 0, 1, 0, 1, 0, 1, ..., $\underline{0}$, $\underline{0}$, *, *, *) = $\underline{0}$ |
| f(0, 1, 0, 1, 0, 1, 0, 1, ..., $\underline{0}$, $\underline{1}$, $\underline{1}$, *, *) = $\underline{1}$ |
| f(0, 1, 0, 1, 0, 1, 0, 1, ..., $\underline{0}$, $\underline{1}$, $\underline{0}$, $\underline{0}$, *) = $\underline{0}$ |
| f(0, 1, 0, 1, 0, 1, 0, 1, ..., $\underline{0}$, $\underline{1}$, $\underline{0}$, $\underline{1}$, $\underline{1}$) = $\underline{1}$ |
| f(0, 1, 0, 1, 0, 1, 0, 1, ..., $\underline{0}$, $\underline{1}$, $\underline{0}$, $\underline{1}$, $\underline{0}$) = $\underline{0}$ |

To obtain a similar table for function (2), $f = f'_N$, all 1's and 0's are reversed:

TABLE 2

| $x_1 \ldots x_N$ |
|---|
| f(0, *, *, *, *, *, *, *, ..., *, *, *, *, *) = 0 |
| f(1, 1, *, *, *, *, *, *, ..., *, *, *, *, *) = 1 |
| f(1, 0, 0, *, *, *, *, *, ..., *, *, *, *, *) = 0 |
| f(1, 0, 1, 1, *, *, *, *, ..., *, *, *, *, *) = 1 |
| f(1, 0, 1, 0, 0, *, *, *, ..., *, *, *, *, *) = 0 |
| f(1, 0, 1, 0, 1, 1, *, *, ..., *, *, *, *, *) = 1 |
| f(1, 0, 1, 0, 1, 0, 0, *, ..., *, *, *, *, *) = 0 |
| ... |
| f(1, 0, 1, 0, 1, 0, 1, 0, ..., $\underline{1}$, $\underline{1}$, *, *, *) = $\underline{1}$ |
| f(1, 0, 1, 0, 1, 0, 1, 0, ..., $\underline{1}$, $\underline{0}$, $\underline{0}$, *, *) = $\underline{0}$ |
| f(1, 0, 1, 0, 1, 0, 1, 0, ..., $\underline{1}$, $\underline{0}$, $\underline{1}$, $\underline{1}$, *) = $\underline{1}$ |
| f(1, 0, 1, 0, 1, 0, 1, 0, ..., $\underline{1}$, $\underline{0}$, $\underline{1}$, $\underline{0}$, $\underline{0}$) = $\underline{0}$ |
| f(1, 0, 1, 0, 1, 0, 1, 0, ..., $\underline{1}$, $\underline{0}$, $\underline{1}$, $\underline{0}$, $\underline{1}$) = $\underline{1}$ |

Again, Table 2 corresponds to the case where N is odd. If N is even, all underlined digits need to be reversed, as in Table 1.

If the circuit designed by FIG. 24 implements function $f_{N-1}$, then $=OR and @=AND. The function itself can be defined as $f(x_1, \ldots, x_{N-1}) = S(A, B, C, x_8, \ldots, x_{N-1})$, where A, B and C depend on $x_1, \ldots, x_7$. Using Table 1 and FIG. 24, the tabular expression of function S is:

TABLE 3

| A | B | C | $x_8$ | ... | $x_{N-1}$ | |
|---|---|---|---|---|---|---|
| S (1, | *, | *, | *, *, *, *, *, ..., *, *, *, *, *) | | | = 1 |
| S (0, | 0, | *, | *, *, *, *, *, ..., *, *, *, *, *) | | | = 0 |
| S (0, | 1, | 1, | *, *, *, *, *, ..., *, *, *, *, *) | | | = 1 |
| S (0, | 1, | 0, | 0, *, *, *, *, ..., *, *, *, *, *) | | | = 0 |
| S (0, | 1, | 0, | 1, 1, *, *, *, ..., *, *, *, *, *) | | | = 1 |
| S (0, | 1, | 0, | 1, 0, 0, *, *, ..., *, *, *, *, *) | | | = 0 |
| S (0, | 1, | 0, | 1, 0, 1, 1, *, ..., *, *, *, *, *) | | | = 1 |
| | | | ... | | | |
| S (0, | 1, | 0, | 1, 0, 1, 0, 1, ..., <u>1</u>, <u>1</u>, *, *, *) | | | = <u>1</u> |
| S (0, | 1, | 0, | 1, 0, 1, 0, 1, ..., <u>1</u>, <u>0</u>, <u>0</u>, *, *) | | | = <u>0</u> |
| S (0, | 1, | 0, | 1, 0, 1, 0, 1, ..., <u>1</u>, <u>0</u>, <u>1</u>, <u>1</u>, *) | | | = <u>1</u> |
| S (0, | 1, | 0, | 1, 0, 1, 0, 1, ..., <u>1</u>, <u>0</u>, <u>1</u>, <u>0</u>, <u>0</u>) | | | = <u>0</u> |
| S (0, | 1, | 0, | 1, 0, 1, 0, 1, ..., <u>1</u>, <u>0</u>, <u>1</u>, <u>0</u>, <u>1</u>) | | | = <u>1</u> |

(Table 3 corresponds to the case where N is odd. If N is even, all underlined digits need to be reversed, as in Table 1.)

Thus, unit S implements the function $f_{N-5}$: $S(A, B, C, x_8, \ldots, x_{N-1}) = f_{N-5}(A, B, C, x_8, \ldots, x_{N-1})$. It means that FIG. 25 implements the function $f_{N-5}(A, B, C, x_9, \ldots, x_N) = A$ OR (B AND (C OR Z)), where A=$x_1$ AND ($x_2$ OR $x_3$) AND ($x_2$ OR $x_4$ OR ($x_5$ AND $x_6$)),
B=$x_1$ AND $x_3$ AND $x_5$ AND $x_7$,
C=$x_8$, and Z=$x_9$ AND ($x_{10}$ OR ($x_{11}$ AND ( . . . ))).

In the present case, $$A \text{ OR } (B \text{ AND } (C \text{ OR } Z)) = [x_1 \text{ AND } (x_2 \text{ OR } x_3) \text{ AND } (x_2 \text{ OR } x_4 \text{ OR } (x_5 \text{ AND } x_6))] \text{ OR } ([x_1 \text{ AND } x_3 \text{ AND } x_5 \text{ AND } x_7] \text{ AND } (x_8 \text{ OR } Z))$$
$$= x_1 \text{ AND } (x_2 \text{ OR } (x_3 \text{ AND } (x_4 \text{ OR } (x_5 \text{ AND } (x_6 \text{ OR } (x_7 \text{ AND } (x_8 \text{ OR } Z))))))).$$

Therefore, the circuit of FIG. 25 performs function $f'_N$. Q.E.D.

To convert the circuit of FIG. 25 to perform function $f_N$, the AND gates are changed to OR gates and vice versa.

Consider the implementation of a circuit with 7300 inputs (the ternary expression of N is 101000101). Referring to the flowchart of FIG. 26, the first four iterations of the process follows the loop of steps 122, 250, 128, 130, 132, 134 and 122 to reduce the number of inputs from 7300 to 812 to 271 to 91. The number of inputs is then reduced to 90 through steps 122, 250, 252, 128, 130, 132, 254, 134 and 122. The first-mentioned loop is repeated twice more to reduce the number of inputs to 30, then 10, the second-mentioned loop is repeated once more to reduce the number of inputs to 9, and the first-mentioned loop is repeated once more to reduce the number of inputs to 3. A final iteration completes the process through steps 122, 124, 126, and end. The steps of the implementation are tabulated as follows:

TABLE 4

| Number of inputs N | Ternary value | Process Steps in FIG. 26 | Result (New N) |
|---|---|---|---|
| 7300 | 101000101 | 122, 250, | 2434 |
| 2434 | 10100011 | 128, 130, | 812 |
| 812 | 1010002 | 132, 134, | 271 |
| 271 | 101001 | 122 | 91 |
| 91 | 10101 | 122, 250, 252, 128, 130, 132, 254, 134, 122 | 30 |
| 30 | 1010 | 122, 250, 128, 130, 132, 134, 122 | 10 |
| 10 | 101 | 122, 250, 252, 128, 130, 132, 254, 134, 122 | 3 |
| 3 | 11 | 122, 124, 126, end | |

FIG. 28 is a flowchart illustrating a process of constructing a circuit according to a third embodiment of the present invention. More particularly, the same circuit as produced by the algorithm shown in FIG. 4, may be generated in another way: by a more regular algorithm, but through larger than necessary intermediate circuits, namely, through an N'-input circuit, where N' is an integer of the form $3^n$ or $2*3^n$ equal to or greater than N (using smallest possible values of N' will reduce design time, but the resulting circuit will be the same). The N'−N inputs are set to designated values, and the unnecessary gates are eliminated.

At step 300 of the process illustrated in FIG. 28, a value of N' is selected that is equal to either $3^n$ or $2*3^n$ and is the minimum value greater than N. For example, if N=12, N' is the next greater value that equals $3^n$ or $2*3^n$, which in this case is 18 ($2*3^2$). At step 302, a circuit with N' inputs and N'/3 outputs is built as it is shown on FIG. 5 (the right-most block 142 has 1 (for odd N') or 4 (for even N') inputs and 0 or 3 gates, respectively). Then, outputs of this circuit are connected to the inputs of a block of the same structure with N'/3 inputs and N'/9 outputs, etc., and finally 3 (for odd N') or 2 (for even N') outputs of the last circuit from FIG. 5 are connected to the inputs of the netlist shown in FIGS. 8 or 7, respectively.

At step 304 the N'−N most significant inputs are set to constants such that the odd-numbered inputs ($x_1, x_3, \ldots$) are set to binary "0" or "1" and the even-numbered inputs ($x_2, x_4 \ldots$) are set to binary "1" or "0". The resulting circuit is the electrical equivalent of the N-input circuit. At step 306, the unnecessary gates are removed, and at step 308 the $ and @ gates are set to logical OR and AND gates based on the function, as described in connection with step 126 in FIG. 4.

For example, the circuit of FIG. 17 (N=12) can be designed based on a circuit of FIG. 29, which is a copy of the circuit of FIG. 23 (N'=18). For function (1), the $ gates are OR gates and the @ gates are AND gates, and the N'−N right-most inputs in FIG. 29 are set so that the odd inputs are binary 0 and the even inputs are binary 1. For function (2), the $ gates are AND gates and the @ gates are OR gates, and the odd N'−N inputs are binary 1 and the even N'−N inputs are binary 0. The N-bit operand input to the circuit will be applied to the N left-most inputs. The application of the binary constants to the $x_1$ to $x_6$ inputs of FIG. 23 (which are labeled "1" or "0" in FIG. 29 to perform function (1)) effectively removes the right-most portion from the circuit of FIG. 29.

It will be appreciated that the application of the fixed values to the N'–N most significant inputs effectively places the $x_1$ input to the input of $ gate 350, permitting elimination of $ gate 352, effectively provides a direct connection from the output of $ gate 350 to $ gate 354, thereby eliminating gates 356, 357, 358 and 359, and effectively provides a direction connection from the output of @ gate 360 to @ gate 362, thereby eliminating @ gates 364, 365 and 366 and $ gate 367. The application of step 304 (FIG. 28) removes all gates that have been eliminated, as well as the fixed binary values, resulting in the circuit shown in FIG. 17.

The present invention thus provides a process for implementing circuits, such as adders and comparators, with practically minimum possible delay and an optimally small number of gates. The following table tabulates the depth of the implementing circuit to the value of N for the process described in the aforementioned Gashkov et al. applications and that of the present invention, both without and with the special circuit construction (FIGS. 4 and 26, respectively). Noteworthy, the Gashkov et al. process can be directly applied only to odd values of N (see FIGS. 2 and 3—note that input $x_{16}$ in FIG. 3 is not connected to the leftmost output of block 102g). Thus, the second column in the table below shows only odd values of N.

TABLE 5

| Depth | N for Gashkov's Process | N for Present Process (Basic Version FIG. 4) | N for Present Process (Optimized Version FIG. 26) |
| --- | --- | --- | --- |
| 0 | 1 | 1 | 1 |
| 1 |  | 2 | 2 |
| 2 | 3 | 3 | 3 |
| 3 | 5 | 4–6 | 4–6 |
| 4 | 7–9 | 7–9 | 7–10 |
| 5 | 11–15 | 10–18 | 11–19 |
| 6 | 17–25 | 19–27 | 20–30 |
| 7 | 27–41 | 28–54 | 31–57 |
| 8 | 43–67 | 55–81 | 58–91 |
| 9 | 69–109 | 82–162 | 92–172 |
| 10 | 111–177 | 163–243 | 173–273 |
| 11 | 179–287 | 244–486 | 274–516 |
| 12 | 289–465 | 487–729 | 517–820 |
| 13 | 467–753 | 730–1458 | 821–1549 |
| 14 | 755–1219 | 1459–2187 | 1550–2460 |
| 15 | 1221–1973 | 2188–4374 | 2461–4647 |
| 16 | 1975–3193 | 4375–6561 | 4648–7381 |

Compared to the process described in the Gashkov et al. applications, the process described herein gives better results for N=17, 19, 43–57, 69–91, 111–117, 179–273, and for all N≧289, and give the same results for all other values of N. Moreover, for large values of N, circuits implemented using the present technique require approximately 12% less depth than the Gashkov et al. technique. Circuit complexity of the present technique is approximately the same as achieved by the Gashkov et al. process. More particularly, both processes require slightly less than 3N/2 binary gates (ANDs and ORs) for implementation of $f_N$ or $f'_N$.

The process according to the invention is preferably carried out by a computer operation under control of a computer readable program containing code and instructions to read data and design the logic circuit. In preferred embodiments, the computer also implements the logic circuit by defining the mask work and parameters of the fabrication process to construct the logic circuit in an integrated circuit (IC) or application-specific integrated circuit (ASIC).

Although the present invention has been described with reference to preferred embodiments, workers skilled in the art will recognize that changes may be made in form and detail without departing from the spirit and scope of the invention.

What is claimed is:

1. A process of implementing a logic circuit for logical operations based on a function $$f_N = x_1 \text{ OR}(x_2 \text{ AND}(x_3 \text{ OR}(x_4 \text{ AND} \ldots x_N \ldots )))$$

or $$f'_N = x_1 \text{ AND}(x_2 \text{ OR}(x_3 \text{ AND}(x_4 \text{ OR} \ldots x_N \ldots ))),$$

comprising steps of:
 a) selecting N as the number of variables of the logic circuit;
 b) defining a top portion of the logic circuit based on a pre-selected pattern of first and second gate types, the top portion defining at least a top level of the logic circuit and having N inputs and ]N/3[ outputs;
 c) defining a lower portion of the logic circuit having the same number of inputs as the number of outputs of the top portion;
 d) defining the inputs of the lower portion as coupled to the outputs of the top portion; and
 e) implementing the logic circuit as the defined top and lower portions with two-input gates to a depth between 2n and 2n+2 where n is an integer and N is between $3^n$ and $3^{n+1}$.

2. A logic circuit for performing logical operations designed by the process of claim 1.

3. A process of implementing a logic circuit for logical operations based on a function $$f_N = x_1 \text{ OR}(x_2 \text{ AND}(x_3 \text{ OR}(x_4 \text{ AND} \ldots x_N \ldots )))$$

or $$f'_N = x_1 \text{ AND}(x_2 \text{ OR}(x_3 \text{ AND}(x_4 \text{ OR} \ldots x_N \ldots ))),$$

comprising steps of:
 a) selecting N as the number of variables of the logic circuit;
 b) transforming groups of three inputs of the function into new groups having at most two variables each;
 c) replacing each new group with a single new variable;
 d) defining a portion of the logic circuit in two-input gates of first and second gate types based on the new variables, the portion having a depth of no more than two levels of the logic circuit; and
 e) iteratively repeating steps (b) to (d) until there are no more than four variables; and
 f) implementing the logic circuit in two-input gates having a depth between 2n and 2n+2 where n is an integer and N is between $3^n$ and $3^{n+1}$.

4. The process of claim 3, wherein the portion defined during a first iteration defines a top level of the circuit having N inputs and ]N/3[ outputs, and each portion defined during successive iterations has the same number of inputs as the number of outputs of the portion defined during the next prior iteration and one-third (rounded up to the nearest integer) that number of outputs.

5. The process of claim 3, wherein the second portion of the logic circuit is based on the number of variables remaining when there are not more than four variables.

6. The process of claim 3, further including steps of:
g) designing the logic circuit with N' inputs, where N' equals $3^n$ or $2*3^n$,
h) setting odd-positioned inputs to a first binary value and even-positioned inputs to a second binary value in the N'−N most significant inputs, and
i) removing gates that do not contribute to the function.

7. The process of claim 3, further including, before step c),
moving a variable from each group of three variables to the new group.

8. The process of claim 3, wherein the depth of the circuit is $2n$, if $3^n < N \leq 2*3^n$, $2n+1$, if $2*3^n < N \leq 3^{n+1}$.

9. A logic circuit for performing logical operations designed by the process of claim 3.

10. A process of implementing a logic circuit for logical operations based on a function $f_N = x_1 \text{ OR}(x_2 \text{ AND}(x_3 \text{ OR}(x_4 \text{ AND} \ldots x_N \ldots )))$ or $f'_N = x_1 \text{ AND}(x_2 \text{ OR}(x_3 \text{ AND}(x_4 \text{ OR} \ldots x_N \ldots )))$, comprising steps of:
a) selecting N as the number of variables of the logic circuit;
b) designing a first logic circuit having N−1 inputs and a pre-selected pattern of first and second gate types, the first logic circuit having a portion receiving I−1 most-significant input where I is smaller than N−1;
c) substituting a predetermined logic circuit having I inputs for the portion of the first logic circuit; and
d) implementing the logic circuit in two-input gates to a depth between 2n and 2n+2 where n is an integer and N is between $3^n$ and $3^{n+1}$.

11. The process of claim 10, wherein portions of the logic circuit are defined iteratively, the portion defined during a first iteration being a top level having N−1 inputs and ](N−1)/3[ outputs, and each portion defined during subsequent iterations having the same number of inputs as the number of outputs of the portion defined during the next prior iteration and one-third that number of outputs.

12. The process of claim 11, further including selecting a bottom portion based on the number of variables remaining when there are no more than four variables.

13. The process of claim 10, wherein the depth of the circuit is $2n$, if $3^n < N \leq 3^n + 3^{n-2} + 3^{n-4} + \ldots$, $2n+1$, if $3^n + 3^{n-2} + 3^{n-4} + \ldots$
   $< N \leq 2*3^n + 3^{n-2} + 3^{n-4} + \ldots$, $2n+2$, if $2*3^n + 3^{n-2} + 3^{n-4} + < N \leq 3^{n+1}$.

14. A logic circuit for performing logical operations designed by the process of claim 10.

15. A process of implementing a logic circuit for logical operations based on a function $f_N = x_1 \text{ OR}(x_2 \text{ AND}(x_3 \text{ OR}(x_4 \text{ AND} \ldots x_N \ldots )))$ or $f'_N = x_1 \text{ AND}(x_2 \text{ OR}(x_3 \text{ AND}(x_4 \text{ OR} \ldots x_N \ldots )))$, comprising steps of:
a) selecting N as the number of variables of the logic circuit;
b) designing the logic circuit with N' inputs, where N'>N and is $3^n$ or $2*3^n$ where n is an integer;
c) setting odd-positioned inputs to a first binary value and even-positioned inputs to a second binary value in the N'−N most significant inputs;
d) removing gates that do not contribute to the function; and
e) implementing the logic circuit with two-input gates to a depth between 2n and 2n+2.

* * * * *